US012562089B2

(12) United States Patent
Zhang et al.

(10) Patent No.: US 12,562,089 B2
(45) Date of Patent: Feb. 24, 2026

(54) PIXEL DRIVING CIRCUIT AND METHOD FOR DRIVING SAME, DISPLAY PANEL, AND DISPLAY DEVICE

(71) Applicants:CHENGDU BOE OPTOELECTRONICS TECHNOLOGY CO., LTD., Sichuan (CN); BOE TECHNOLOGY GROUP CO., LTD., Beijing (CN)

(72) Inventors: Tiaomei Zhang, Beijing (CN); Erjin Zhao, Beijing (CN); Zhiliang Jiang, Beijing (CN); Ming Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/994,661

(22) PCT Filed: Jan. 31, 2023

(86) PCT No.: PCT/CN2023/074031
§ 371 (c)(1),
(2) Date: Jan. 15, 2025

(87) PCT Pub. No.: WO2024/159421
PCT Pub. Date: Aug. 8, 2024

(65) Prior Publication Data
US 2026/0018095 A1     Jan. 15, 2026

(51) Int. Cl.
*G09G 3/20*       (2006.01)
*H10D 86/40*       (2025.01)
*H10D 86/60*       (2025.01)

(52) U.S. Cl.
CPC ............. *G09G 3/20* (2013.01); *H10D 86/441* (2025.01); *H10D 86/60* (2025.01);
(Continued)

(58) Field of Classification Search
CPC ............. G09G 3/20; G09G 2300/0426; G09G 2300/0819; G09G 2300/0852;
(Continued)

(56) References Cited

U.S. PATENT DOCUMENTS 11,087,688 B2 *   8/2021   Lin ...................... G09G 3/3258
2015/0371584 A1 *   12/2015   Lin ...................... G09G 3/3266
                   345/214

(Continued)

FOREIGN PATENT DOCUMENTS

CN       103137067 A     6/2013
CN       109509427 A     3/2019
(Continued)

OTHER PUBLICATIONS

International Search Report of application No. PCT/CN2023/074031 dated Oct. 24, 2023.

(Continued)

*Primary Examiner* — Sejoon Ahn
(74) *Attorney, Agent, or Firm* — Calfee, Halter & Griswold LLP

(57) ABSTRACT

A pixel driving circuit includes a drive circuit connected to a first node, a second node, and a third node and configured to input a driving current to the third node using the second node based on a voltage of the first node; a first compensation circuit connected to the first node, the third node, and a first gate drive signal terminal and configured to connect the first node to the third node in response to a signal from the first gate drive signal terminal; and a first reset circuit connected to the third node, a first reset signal terminal, and (Continued)

a first initial signal terminal and configured to transmit a signal from the first initial signal terminal to the third node in response to a signal from the first reset signal terminal.

11 Claims, 29 Drawing Sheets

(52) U.S. Cl.
CPC .............. *G09G 2300/0426* (2013.01); *G09G 2300/0819* (2013.01); *G09G 2300/0852* (2013.01); *G09G 2300/0861* (2013.01); *G09G 2310/08* (2013.01); *G09G 2320/0247* (2013.01)

(58) Field of Classification Search
CPC ....... G09G 2300/0861; G09G 2310/08; G09G 2320/0247; H10D 86/441; H10D 86/60
See application file for complete search history.

(56) References Cited

U.S. PATENT DOCUMENTS

| | | | | |
|---|---|---|---|---|
| 2016/0055829 | A1* | 2/2016 | Lin | G09G 3/3266 |
| | | | | 345/213 |
| 2017/0103706 | A1* | 4/2017 | Yang | G06F 3/044 |
| 2019/0340979 | A1* | 11/2019 | Yang | G09G 3/3233 |
| 2022/0005400 | A1* | 1/2022 | Feng | G09G 3/2092 |
| 2022/0020324 | A1* | 1/2022 | Yuan | G11C 19/28 |
| 2022/0114951 | A1* | 4/2022 | Chang | G09G 3/32 |
| 2022/0122534 | A1 | 4/2022 | Kim | |
| 2022/0406261 | A1* | 12/2022 | Zhai | G11C 19/28 |
| 2023/0042966 | A1* | 2/2023 | Huangfu | G09G 3/3258 |
| 2023/0274696 | A1* | 8/2023 | Liu | H10H 29/142 |
| | | | | 345/212 |

FOREIGN PATENT DOCUMENTS

| | | |
|---|---|---|
| CN | 110942743 A | 3/2020 |
| CN | 114038430 A | 2/2022 |
| CN | 114222615 A | 3/2022 |
| CN | 114495835 A | 5/2022 |

OTHER PUBLICATIONS

Written Opinion of application No. PCT/CN2023/074031 dated Oct. 24, 2023.

* cited by examiner

PIXEL DRIVING CIRCUIT AND METHOD FOR DRIVING SAME, DISPLAY PANEL, AND DISPLAY DEVICE

CROSS-REFERENCE TO RELATED APPLICATION

The present application is a U.S. national phase application of International Application No. PCT/CN2023/074031, filed on Jan. 31, 2023, the entire contents of which are hereby incorporated by reference in its entirety.

TECHNICAL FIELD

The present disclosure relates to the field of display technologies, and in particular, to a pixel driving circuit, a method for driving the pixel driving circuit, a display panel, and a display device.

BACKGROUND

In the related art, a pixel driving circuit includes a drive transistor. A hysteresis phenomenon of the drive transistor and a leakage problem of a gate of the drive transistor may affect the normal driving of the pixel driving circuit.

It is to be noted that the information disclosed above in the "BACKGROUND" section is intended only to enhance understanding of the context of the present disclosure, and thus may include information that does not constitute prior art known to those of ordinary skill in the art.

SUMMARY

According to an aspect of the present disclosure, there is provided a pixel driving circuit. The pixel driving circuit includes a drive circuit, a first compensation circuit, and a first reset circuit. The drive circuit is connected to a first node, a second node, and a third node, and configured to input a driving current to the third node using the second node based on a voltage of the first node. The first compensation circuit is connected to the first node, the third node, and a first gate drive signal terminal, and configured to connect the first node to the third node in response to a signal from the first gate drive signal terminal. The first reset circuit is connected to the third node, a first reset signal terminal, and a first initial signal terminal, and configured to transmit a signal from the first initial signal terminal to the third node in response to a signal from the first reset signal terminal.

In an exemplary embodiment of the present disclosure, the pixel driving circuit further includes a third reset circuit, connected to the second node, a third initial signal terminal, and a second reset signal terminal, and configured to transmit a signal from the third initial signal terminal to the second node in response to a signal from the second reset signal terminal.

In an exemplary embodiment of the present disclosure, the pixel driving circuit is configured to drive a light-emitting unit to emit light, and the pixel driving circuit further includes: a second reset circuit, wherein the second reset circuit, the first reset circuit, and the third reset circuit have a same polarity of conduction level; and wherein the second reset circuit is connected to a first electrode of the light-emitting unit, and a second initial signal terminal, and is further connected to the first reset signal terminal or the second reset signal; and the second reset circuit is configured to transmit a signal from the second initial signal terminal to the first electrode of the light-emitting unit in response to the signal from the first reset signal terminal or the second reset signal terminal.

In an exemplary embodiment of the present disclosure, the pixel driving circuit is configured to drive a light-emitting unit to emit light, and further includes: a second reset circuit, wherein the second reset circuit, the first reset circuit, and the third reset circuit have a same polarity of conduction level; and wherein the second reset circuit is connected to a first electrode of the light-emitting unit, a second initial signal terminal, the first reset signal terminal, and the second reset signal terminal; and the second reset circuit is configured to transmit a signal from the second initial signal terminal to the first electrode of the light-emitting unit in response to the signal from the first reset signal terminal, and the second reset circuit is configured to transmit the signal from the second initial signal terminal to the first electrode of the light-emitting unit in response to the signal from the second reset signal terminal.

In an exemplary embodiment of the present disclosure, the pixel driving circuit further includes: a second storage circuit connected to the second node and configured to store a charge of the second node.

In an exemplary embodiment of the present disclosure, the pixel driving circuit further includes: a second compensation circuit, connected to the first node and a reference signal terminal, and configured to transmit a signal from the reference signal terminal to the first node.

In an exemplary embodiment of the present disclosure, the drive circuit includes: a drive transistor with a first electrode connected to the second node, a second electrode connected to the third node, and a gate connected to the first node. The first compensation circuit includes a second transistor with a first electrode connected to the first node, a second electrode connected to the third node, and a gate connected to the first gate drive signal terminal. The first reset circuit includes a first transistor with a first electrode connected to the first initial signal terminal, a second electrode connected to the third node, and a gate connected to the first reset signal terminal.

In an exemplary embodiment of the present disclosure, the third reset circuit includes: an eighth transistor with a first electrode connected to the third initial signal terminal, a second electrode connected to the second node, and a gate connected to the second reset signal terminal.

In an exemplary embodiment of the present disclosure, the second reset circuit includes: a seventh transistor with a first electrode connected to the second initial signal terminal, a second electrode connected to the first electrode of the light-emitting unit, and the gate connected to the first reset signal terminal or the second reset signal terminal.

In an exemplary embodiment of the present disclosure, the second reset circuit includes: a seventh transistor and a ninth transistor. A first electrode of the seventh transistor is connected to the second initial signal terminal, a second electrode of the seventh transistor is connected to the first electrode of the light-emitting unit, and a gate of the seventh transistor is connected to the first reset signal terminal. A first electrode of the ninth transistor is connected to the second initial signal terminal, a second electrode of the ninth transistor is connected to the first electrode of the light-emitting unit, and a gate of the ninth transistor is connected to the second reset signal terminal.

In an exemplary embodiment of the present disclosure, the second storage circuit includes a second capacitor with a first electrode connected to the second node.

In an exemplary embodiment of the present disclosure, the second compensation circuit includes a tenth transistor with a first electrode connected to the reference signal terminal and a gate connected to the first node.

In an exemplary embodiment of the present disclosure, the pixel driving circuit is configured to drive a light-emitting unit to emit light, and the pixel driving circuit further includes: a data writing circuit, a light-emitting control circuit, and a first storage circuit. The data writing circuit is connected to the second node, a data signal terminal, and a second gate drive signal terminal, and configured to transmit a signal from the data signal terminal to the second node in response to a signal from the second gate drive signal terminal. The light-emitting control circuit is connected to a first power supply terminal, the second node, the third node, a first electrode of the light-emitting unit, and an enabling signal terminal, and configured to connect the first power supply terminal to the second node in response to a signal from the enabling signal terminal, and to connect the third node to the first electrode of the light-emitting unit in response to the signal from the enabling signal terminal. The first storage circuit is connected between the first node and the first power supply terminal.

In an exemplary embodiment of the present disclosure, the data writing circuit includes a fourth transistor with a first electrode connected to the data signal terminal, a second electrode connected to the second node, and a gate connected to the second gate drive signal terminal. The light-emitting control circuit includes a fifth transistor and a sixth transistor. A first electrode of the fifth transistor is connected to the first power supply terminal, a second electrode of the fifth transistor is connected to the second node, and a gate of the fifth transistor is connected to the enabling signal terminal. A first electrode of the sixth transistor is connected to the third node, a second electrode of the sixth transistor is connected to the first electrode of the light-emitting unit, and a gate of the sixth transistor is connected to the enabling signal terminal. The first storage circuit includes a first capacitor connected between the first node and the first power supply terminal.

According to an aspect of the present disclosure, there is provided a method for driving a pixel driving circuit. The method is configured for driving the pixel driving circuit as described above. The method includes:

in a first phase, inputting an active level to the first reset signal terminal and inputting an inactive level to the first gate drive signal terminal; and in a second phase, inputting an active level to the first reset signal terminal and the first gate drive signal terminal.

In an exemplary embodiment of the present disclosure, the pixel driving circuit further includes:

a data writing circuit, connected to the second node, a data signal terminal, and a second gate drive signal terminal, and configured to transmit a signal from the data signal terminal to the second node in response to a signal from the second gate drive signal terminal;

the method further includes:

in a third phase, inputting an active level to the first gate drive signal terminal and the second gate drive signal terminal, and inputting an inactive level to the first reset signal terminal;

and in a fourth phase, inputting an active level to the first gate drive signal terminal, and inputting an inactive level to the first reset signal terminal and the second gate drive signal terminal.

In an exemplary embodiment of the present disclosure, the method further includes:

in a fifth phase, inputting an active level to the first reset signal terminal, and inputting an inactive level to the first gate drive signal terminal.

According to an aspect of the present disclosure, there is provided a method for driving a pixel driving circuit. The method is configured for driving the pixel driving circuit as described above. The method includes:

in the first phase, inputting an active level to the second reset signal terminal, and inputting an inactive level to the first gate drive signal terminal and the first reset signal terminal; and in the second phase, inputting an active level to the first reset signal terminal and the first gate drive signal terminal, and inputting an inactive level to the second reset signal terminal.

According to an aspect of the present disclosure, there is provided a display panel that includes the pixel driving circuit as described above.

According to an aspect of the present disclosure, there is provided a display panel that includes a pixel driving circuit, wherein the pixel driving circuit includes: a drive transistor, a first transistor, and a second transistor. A first electrode of the first transistor is connected to a first initial signal line and a second electrode of the first transistor is connected to a second electrode of the drive electrode. A first electrode of the second transistor is connected to a gate of the drive transistor and a second electrode of the second transistor is connected to the second electrode of the drive electrode. The display panel further includes: a base substrate, an active layer, and a first conductive layer. The active layer is disposed on a side of the base substrate, and the active layer includes a first active portion, a second active portion, and a third active portion, wherein the first active portion is configured to form a channel region for the first transistor; the second active portion is configured to form a channel region for the second transistor; and the third active portion is configured to form a channel region for the drive transistor. The first conductive layer is disposed on a side of the active layer away from the base substrate, and includes a first gate line, a first reset signal line, and a first conductive portion, wherein an orthographic projection of the first gate line on the base substrate extends in a first direction and covers an orthographic projection of the second transistor on the base substrate, a portion of the first gate line being configured to form a gate of the second transistor; an orthographic projection of the first reset signal line on the base substrate extends in the first direction and covers an orthographic projection of the first active portion on the base substrate, a portion of the first reset signal line being configured to form a gate of the first transistor; and an orthographic projection of the first conductive portion on the base substrate overs an orthographic projection of the third active portion on the base substrate, the first conductive portion being configured to form the gate of the drive transistor.

In an exemplary embodiment of the present disclosure, the pixel driving circuit further includes a fifth transistor and a second capacitor. A first electrode of the second capacitor is connected to a first electrode of the drive transistor and a second electrode of the second capacitor is connected to a power line. A first electrode of the fifth transistor is connected to the power line and a second electrode of the fifth transistor is connected to the first electrode of the drive transistor. The active layer further includes a fifth active portion and a ninth active portion, wherein the fifth active portion is configured to form a channel region for the fifth transistor, and the ninth active portion is connected between the third active portion and the fifth active portion and configured to form the first electrode of the second capacitor. The first conductive layer further includes an enabling signal line, an orthographic projection of the enabling signal line on the base substrate extending in the first direction and covering an orthographic projection of the fifth active portion on the base substrate, a portion of the enabling signal line being configured to form a gate of the fifth transistor, wherein a size of an orthographic projection of the ninth active portion on the base substrate in the first direction, is greater than a size of the orthographic projection of the fifth active portion on the base substrate in the first direction. The display panel further includes a second conductive layer on a side of the first conductive layer away from the base substrate, the second conductive layer including a third conductive portion configured to form the second electrode of the second capacitor, wherein an orthographic projection of the third conductive portion on the base substrate is at least partially overlapped with the orthographic projection of the ninth active portion on the base substrate.

In an exemplary embodiment of the present disclosure, the display panel further includes a light-emitting unit, wherein the pixel driving circuit further includes: a seventh transistor and an eighth transistor. A first electrode of the seventh transistor is connected to a second initial signal line and a second electrode of the seventh transistor is connected to a first electrode of the light-emitting unit. A first electrode of the eighth transistor is connected to a third initial signal line and a second electrode of the eighth transistor is connected to a first electrode of the drive transistor. The active layer further includes: a seventh active portion and an eighth active portion. The seventh active portion is configured to form a channel region for the seventh transistor. The eighth active portion is connected to the third active portion and configured to form a channel region for the eighth transistor. The first conductive layer further includes a second reset signal line, an orthographic projection of the second reset signal line on the base substrate extending in the first direction and covering an orthographic projection of the seventh active portion on the base substrate and an orthographic projection of the eighth active portion on the base substrate, a portion of the second reset signal line being configured to form a gate of the seventh transistor and a gate of the eighth transistor, respectively. The orthographic projection of the first gate line on the base substrate is between the orthographic projection of the first reset signal line on the base substrate and the orthographic projection of the first conductive portion on the base substrate. The orthographic projection of the second reset signal line on the base substrate is on a side, away from the orthographic projection of the first gate line on the base substrate, of the orthographic projection of the first conductive portion on the base substrate.

In an exemplary embodiment of the present disclosure, the pixel driving circuit further includes a fourth transistor with a first electrode connected to a data line and a second electrode connected to the first electrode of the drive transistor. The active layer further includes a fourth active portion configured to form a channel region for the fourth transistor, the fourth active portion and the third active portion being connected in a same layer. The first conductive layer further includes a second gate line, an orthographic projection of the second gate line on the base substrate covering an orthographic projection of the fourth active portion on the base substrate, a portion of the second gate line being configured to form a gate of the fourth transistor. The orthographic projection of the second gate line on the base substrate is between the orthographic projection of the first gate line on the base substrate and the orthographic projection of the first reset signal line on the base substrate.

In an exemplary embodiment of the present disclosure, the display panel further includes a light-emitting unit, wherein the pixel driving circuit further includes: a seventh transistor with a first electrode connected to a second initial signal line and a second electrode connected to a first electrode of the light-emitting unit. The active layer further includes a seventh active portion configured to form a channel region for the seventh transistor. The orthographic projection of the first reset signal line on the base substrate covers an orthographic projection of the seventh active portion on the base substrate, a portion of the first reset signal line being configured to form the gate of the seventh transistor.

According to an aspect of the present disclosure, there is provided a display device that includes the display panel as described above.

It is to be understood that the above general description and the following detailed descriptions are exemplary and explanatory only and do not limit the present disclosure.

BRIEF DESCRIPTION OF THE DRAWINGS

The accompanying drawings herein are incorporated into the specification and form part of the specification, which show embodiments consistent with the present disclosure, and are used in conjunction with the specification to explain the principles of the present disclosure. It will be apparent that the accompanying drawings in the following description are only some of embodiments of the present disclosure, and that other drawings may be obtained from these drawings without creative effort by those of ordinary skill in the art.

DETAILED DESCRIPTION

Figure 1:
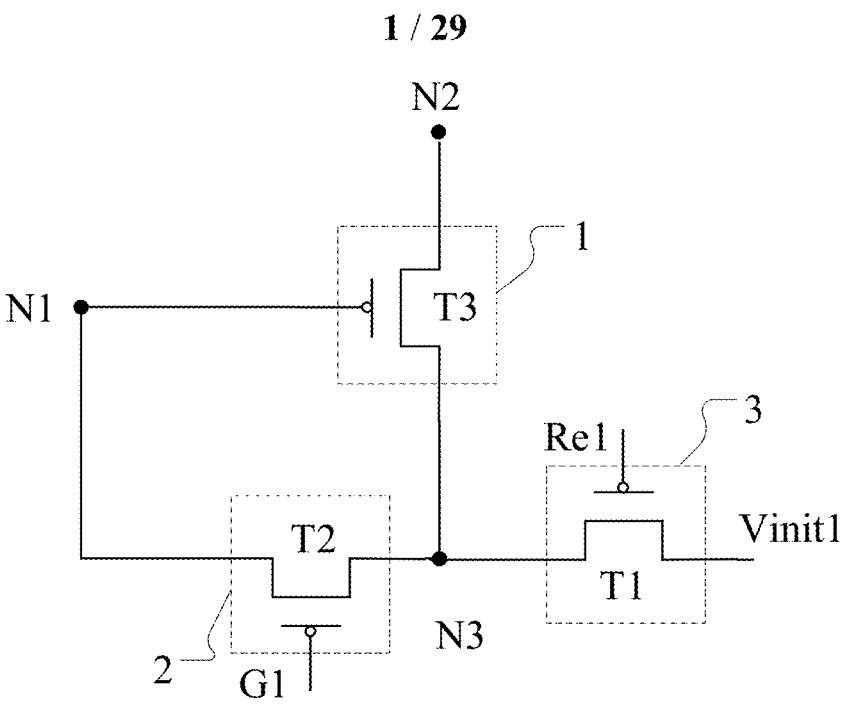
FIG. 1 is a schematic diagram of a structure of a pixel driving circuit according to an exemplary embodiment of the present disclosure.

Exemplary embodiments will now be described more fully with reference to the accompanying drawings. However, the exemplary embodiments can be implemented in a variety of forms and should not be construed as being limited to the examples set forth herein; rather, the provision of these embodiments makes the present disclosure comprehensive and complete and conveys the concepts of the exemplary embodiments to those skilled in the art in a comprehensive manner. The same numerals in the drawings indicate the same or similar structions, and thus detailed descriptions of them will be omitted.

The terms "a/an", "one", "the/said" are used to indicate the presence of one or more elements/components/etc. The terms "comprising/including" and "having/provided with" are used to indicate open-ended inclusion, and mean that there may be other elements/components/etc. in addition to the listed elements/components/etc.

As shown in FIG. 1, it is a schematic diagram of a structure of a pixel driving circuit according to an exemplary embodiment of the present disclosure. The pixel driving circuit may include: a drive circuit 1, a first compensation circuit 2, and a first reset circuit 3. The drive circuit 1 is connected to a first node N1, a second node N2, and a third node N3, and is configured to input a driving current to the third node N3 using the second node N2 based on a voltage of the first node N1. The first compensation circuit 2 is connected to the first node N1, the third node N3, and a first gate drive signal terminal G1, and is configured to connect the first node N1 to the third node N3 in response to a signal from the first gate drive signal terminal G1. The first reset circuit 3 is connected to the third node N3, a first reset signal terminal Re1, and a first initial signal terminal Vinit1, and is configured to transmit a signal from the first initial signal terminal Vinit1 to the third node N3 in response to a signal from the first reset signal terminal Re1.

In this exemplary embodiment, in a first phase, the pixel driving circuit may be operated in the following manner: an active level is inputted to the first reset signal terminal Re1 to turn on the first reset circuit 3; an inactive level is inputted to the first gate drive signal terminal G1 to turn off the first compensation circuit 2; and an initial signal is inputted to the third node N3 from the first initial signal terminal Vinit1 to ameliorate a hysteresis problem in the drive circuit 1. In a second phase, the pixel driving circuit may be operated in the following manner: an active level is inputted to the first reset signal terminal Re1 and the first gate drive signal terminal G1 to turn on the first reset circuit 3 and the first compensation circuit 2 simultaneously. The initial signal is inputted to the first node N1 from the first initial signal terminal Vinit1 to remove the charge stored in the first node N1 from the previous frame. On the one hand, the display panel can ameliorate the hysteresis problem of the drive circuit 1; and on the other hand, the first node N1 is connected only to the first compensation circuit 2, and therefore, the leakage current of the first node N1 can be reduced in the display panel. Here, the active level is a level that turns on the target circuit, and the inactive level is a level that turns off the target circuit.

In this exemplary embodiment, as shown in FIG. 1, the drive circuit 1 may include a drive transistor T3. A first electrode of the drive transistor T3 is connected to the second node N2, a second electrode of the drive transistor T3 is connected to the third node N3, and a gate of the drive transistor T3 is connected to the first node N1. The first compensation circuit 2 may include a second transistor T2. A first electrode of the second transistor T2 is connected to the first node N1, a second electrode of the second transistor T2 is connected to the third node N3, and a gate of the second transistor T2 is connected to the first gate drive signal terminal G1. The first reset circuit 3 may include a first transistor T1. A first electrode of the first transistor T1 is connected to the first initial signal terminal Vinit1, a second electrode of the first transistor T1 is connected to the third node N3, and a gate of the first transistor T1 is connected to the first reset signal terminal Re1. Here, the first transistor T1, the second transistor T2, and the drive transistor T3 may be P-type transistors.

Figure 2:
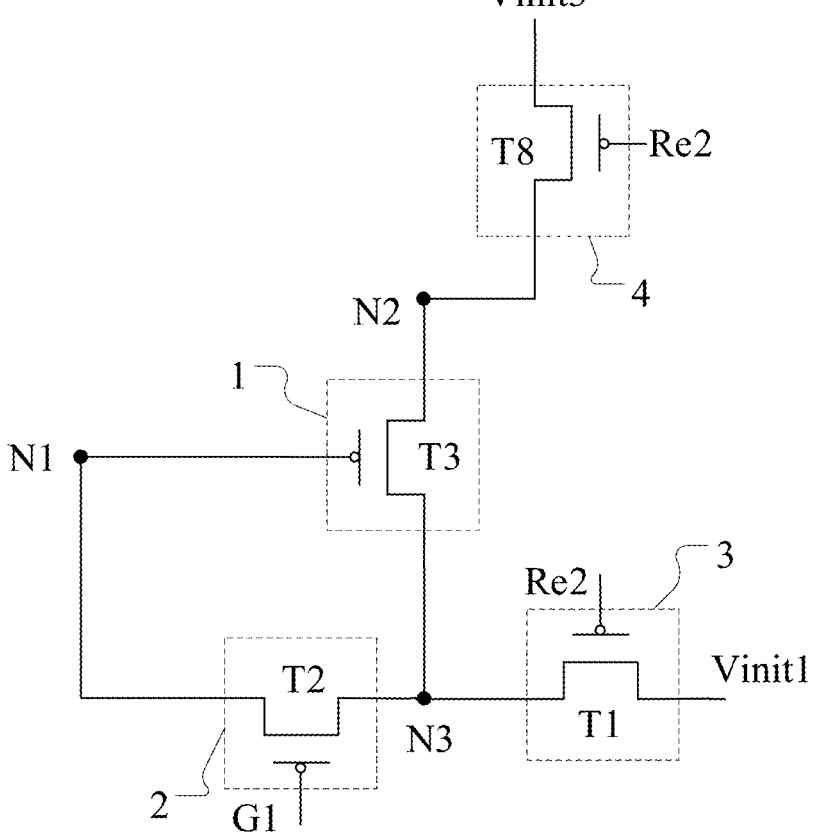
FIG. 2 is a schematic diagram of a structure of a pixel driving circuit according to another exemplary embodiment of the present disclosure.

As shown in FIG. 2, it is a schematic diagram of a structure of a pixel driving circuit according to another exemplary embodiment of the present disclosure. In this exemplary embodiment, the pixel driving circuit may further include a third reset circuit 4. The third reset circuit 4 is connected to the second node N2, a third initial signal terminal Vinit3, and a second reset signal terminal Re2, and is configured to transmit a signal from the third initial signal terminal Vinit3 to the second node N2 in response to a signal from the second reset signal terminal Re2.

In this exemplary embodiment, in a first phase, the pixel driving circuit may be operated in the following manner: an inactive level is inputted to the first reset signal terminal Re1 and the first gate drive signal terminal G1 to turn off the first reset circuit 3 and the first compensation circuit 2; and an active level is inputted to the second reset signal terminal Re2 to turn on the third reset circuit 4. The initial signal is inputted to the second node N2 from the third initial signal terminal Vinit3 to ameliorate the hysteresis problem of the drive circuit 1. In a second phase, the pixel driving circuit may be operated in the following manner: an inactive level is inputted to the second reset signal terminal Re2 to turn off the third reset circuit 4; and an active level is inputted to the first gate drive signal terminal G1 and the first reset signal terminal Re1 to turn on the first reset circuit 3 and the first compensation circuit 2. The initial signal is inputted to the first node N1 from the first initial signal terminal Vinit1 to remove the charge stored in the first node N1 from the previous frame. The display panel provided in this exemplary embodiment can also ameliorate the hysteresis problem of the drive circuit 1 and reduce the leakage current of the first node N1.

As shown in FIG. 2, the third reset circuit 4 may include an eighth transistor T8. A first electrode of the eighth transistor T8 is connected to the third initial signal terminal Vinit3, a second electrode of the eighth transistor T8 is connected to the second node N2, and a gate of the eighth transistor T8 is connected to the second reset signal terminal Re2. Here, the eighth transistor T8 may be a P-type transistor.

Figure 3:
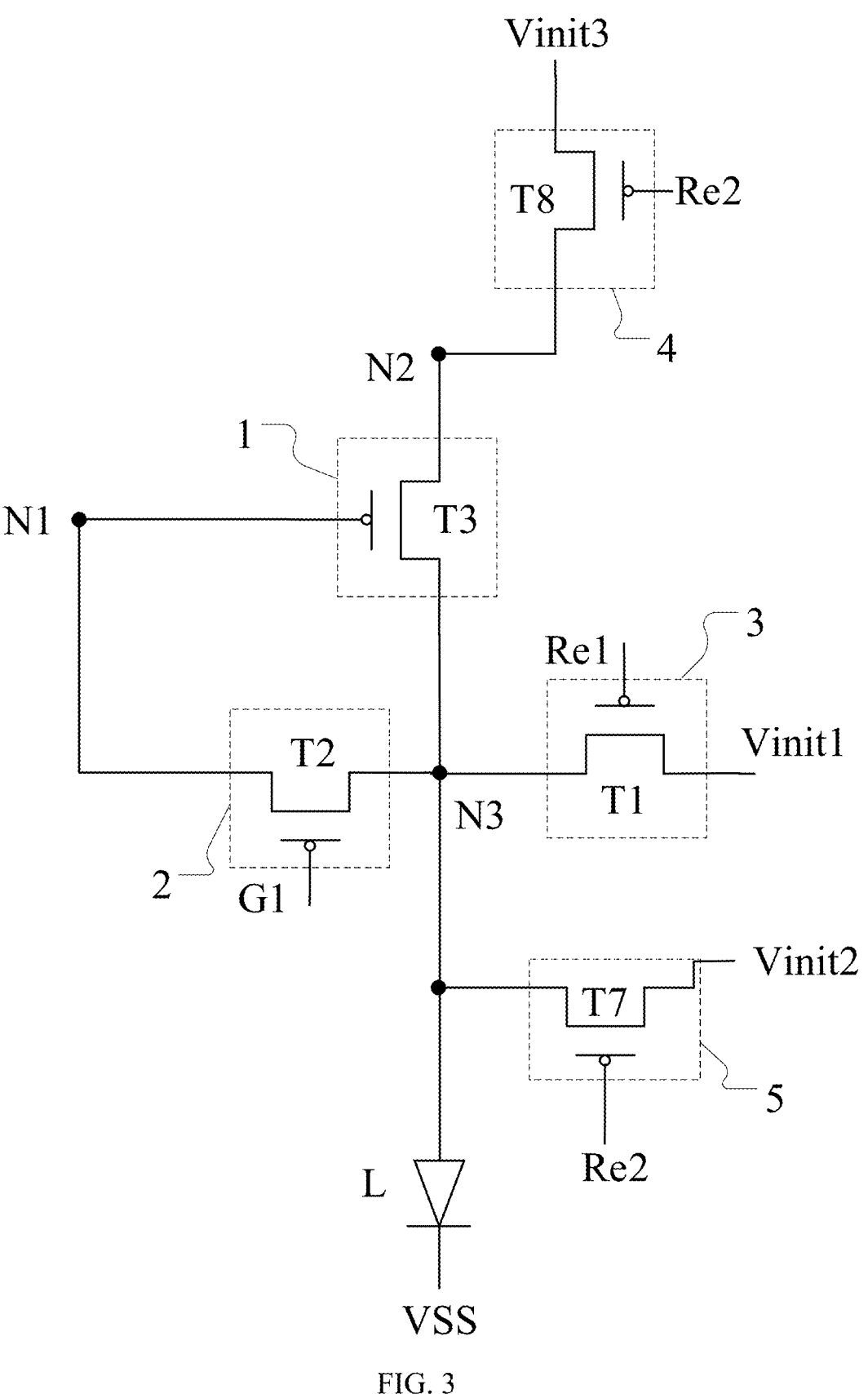
FIG. 3 is a schematic diagram of a structure of a pixel driving circuit according to another exemplary embodiment of the present disclosure.

As shown in FIG. 3, it is a schematic diagram of a structure of a pixel driving circuit according to another exemplary embodiment of the present disclosure. In this exemplary embodiment, the pixel driving circuit can be configured to drive a light-emitting unit L to emit light, and the pixel driving circuit may further include a second reset circuit 5. The second reset circuit 5 and the third reset circuit 4 have the same polarity of the conduction level. The second reset circuit 5 is connected to a second initial signal terminal Vinit2, and a first electrode of the light-emitting unit L, and is further connected to a second reset signal terminal Re2. The second reset circuit 5 is configured to transmit a signal from the second initial signal terminal Vinit2 to the first electrode of the light-emitting unit L in response to a signal from the second reset signal terminal Re2, in order to reset the first electrode of the light-emitting unit.

As shown in FIG. 3, the second reset circuit 5 may include a seventh transistor T7. A first electrode of the seventh transistor T7 is connected to the second initial signal terminal Vinit2, a second electrode of the seventh transistor T7 is connected to the first electrode of the light-emitting unit L, and a gate of the seventh transistor T7 is connected to the second reset signal terminal Re2.

It is to be understood that in other exemplary embodiments, the second reset circuit 5 may also have the same polarity of the conduction level as the first reset circuit 3, the second reset circuit 5 may be connected to the first reset signal terminal Re1, and the second reset circuit 5 may be configured to transmit a signal from the second initial signal terminal Vinit2 to the first electrode of the light-emitting unit L in response to a signal from the first reset signal terminal Re1, in order to reset the first electrode of the light-emitting unit.

Figure 4:
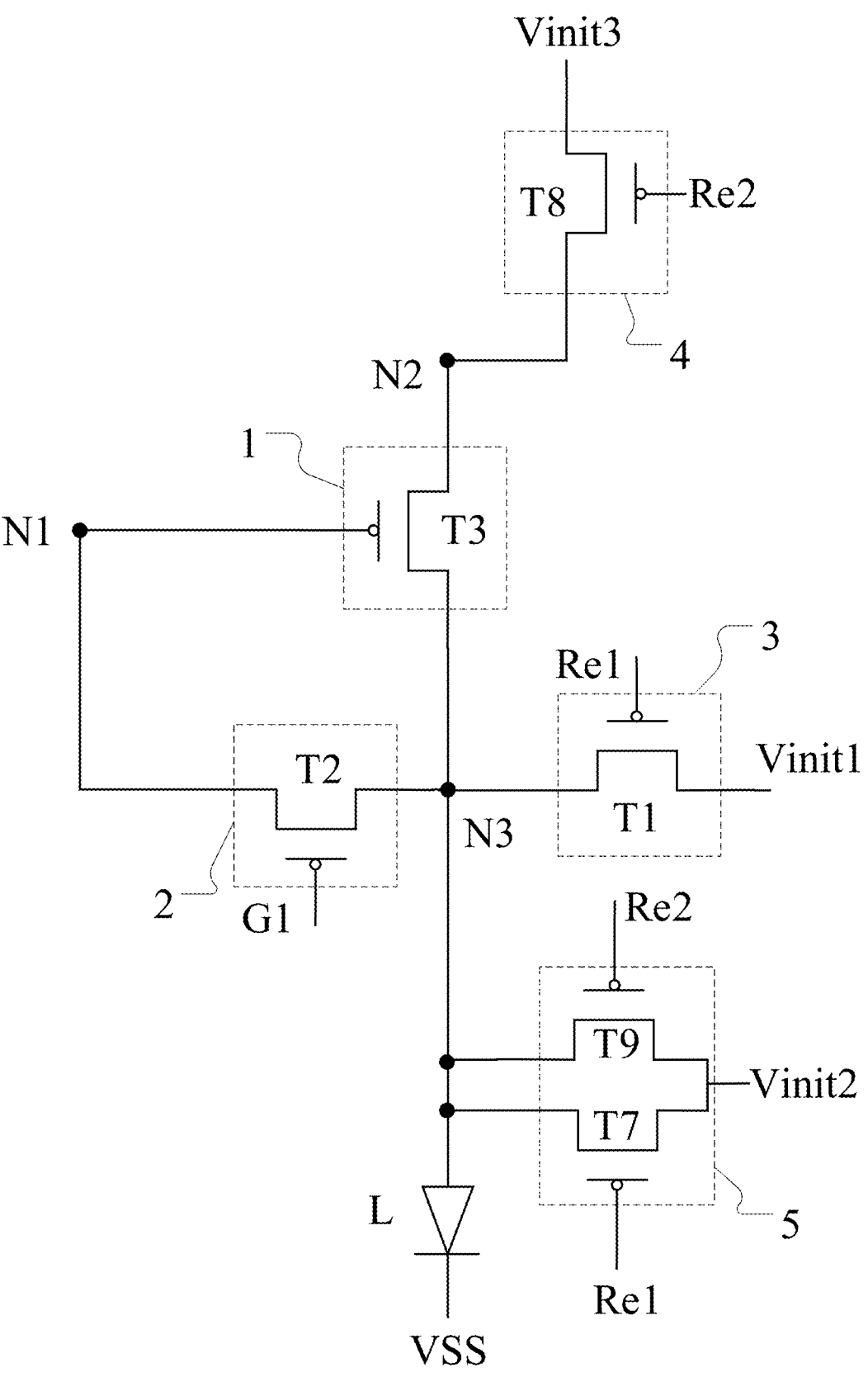
FIG. 4 is a schematic diagram of a structure of a pixel driving circuit according to another exemplary embodiment of the present disclosure.

As shown in FIG. 4, it is a schematic diagram of a structure of a pixel driving circuit according to another exemplary embodiment of the present disclosure. In this exemplary embodiment, the pixel driving circuit can be configured to drive the light-emitting unit L to emit light, and the pixel driving circuit may further include a second reset circuit 5. The second reset circuit 5, the first reset circuit 3, and the third reset circuit 4 have the same polarity of the conduction level. The second reset circuit 5 may be connected to a first electrode of the light-emitting unit L, a second initial signal terminal Vinit2, a first reset signal terminal Re1, and a second reset signal terminal Re2. The second reset circuit 5 may be configured to transmit a signal from the second initial signal terminal Vinit2 to the first electrode of the light-emitting unit L in response to a signal from the first reset signal terminal Re1; and the second reset circuit 5 may be configured to transmit a signal from the second initial signal terminal Vinit2 to the first electrode of the light-emitting unit L in response to a signal from the second reset signal terminal Re2.

As shown in FIG. 4, the second reset circuit 5 may include a seventh transistor T7 and a ninth transistor T9. A first electrode of the seventh transistor T7 is connected to the second initial signal terminal Vinit2, a second electrode of the seventh transistor T7 is connected to the first electrode of the light-emitting unit L, and a gate of the seventh transistor T7 is connected to the first reset signal terminal Re1. A first electrode of the ninth transistor T9 is connected to the second initial signal terminal Vinit2, a second electrode of the ninth transistor T9 is connected to the first electrode of the light-emitting unit L, and a gate of the ninth transistor T9 is connected to the second reset signal terminal Re2.

In this exemplary embodiment, the second reset circuit 5 may be turned on when the first reset circuit 3 or the third reset circuit 4 is turned on, in order to reset the first electrode of the light-emitting unit L. This may increase the number of resets of the light-emitting unit L.

Figure 5:
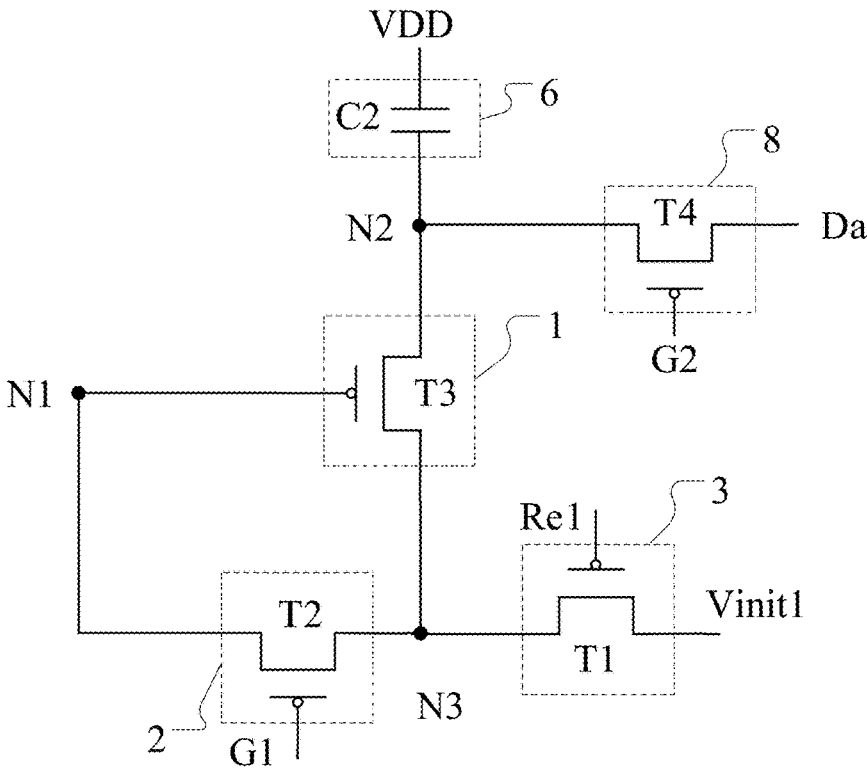
FIG. 5 is a schematic diagram of a structure of a pixel driving circuit according to another exemplary embodiment of the present disclosure.

As shown in FIG. 5, it is a schematic diagram of a structure of a pixel driving circuit according to another exemplary embodiment of the present disclosure. The pixel driving circuit shown in FIG. 5 includes a second storage circuit 6 and a data writing circuit 8 in addition to the pixel driving circuit shown in FIG. 1. The second storage circuit 6 is connected to the second node N2 and is configured to store the charge of the second node N2. The data writing circuit 8 is connected to the second node N2, a data signal terminal Da, and a second gate drive signal terminal G2, and is configured to transmit a signal from the data signal terminal Da to the second node N2 in response to a signal from the second gate drive signal terminal G2. As shown in FIG. 5, the second storage circuit 6 may include a second capacitor C2. A first electrode of the second capacitor C2 is connected to the second node N2, and a second electrode of the second capacitor C2 is connected to a first power supply terminal VDD. The data writing circuit 8 may include a fourth transistor T4. A first electrode of the fourth transistor T4 is connected to the data signal terminal Da, a second electrode of the fourth transistor T4 is connected to the second node N2, and a gate of the fourth transistor T4 is connected to the second gate drive signal terminal G2.

This pixel driving circuit may write a compensation voltage containing a data signal to the first node N1 through the data writing circuit 8, the drive circuit 1, and the first compensation circuit 2. Meanwhile, since the pixel driving circuit is further provided with the second storage circuit 6, the first compensation circuit 2 may be continuously turned on when the data writing circuit 8 is turned off, and the second node N2 may continuously write the compensation voltage to the first node. For example, the first compensation circuit 2 may be continuously turned on during the scanning phase of multiple rows of pixel driving circuits, and the data signal stored in the second storage circuit 6 may continuously write the compensation voltage to the first node N1, so that the time for writing the compensation voltage to the first node N1 may be increased while the driving frequency remains unchanged. On the one hand, with the setting, the compensation voltage can be sufficiently written to the first node N1 to improve the brightness difference between pixel rows; on the other hand, this setting can further improve the hysteresis problem of the drive transistor T3; and on the yet another hand, the setting is favorable to the high-frequency design of the display panel.

Figure 6:
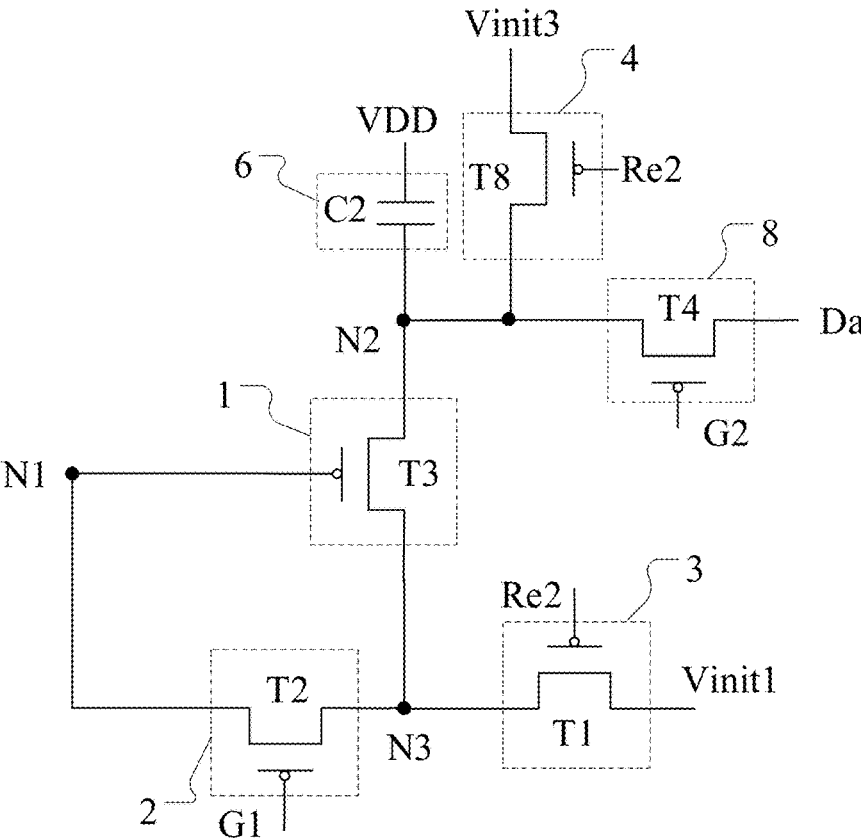
FIGS. 6-8 are schematic diagrams of structures of pixel driving circuits according to other exemplary embodiments of the present disclosure.
Figure 7:
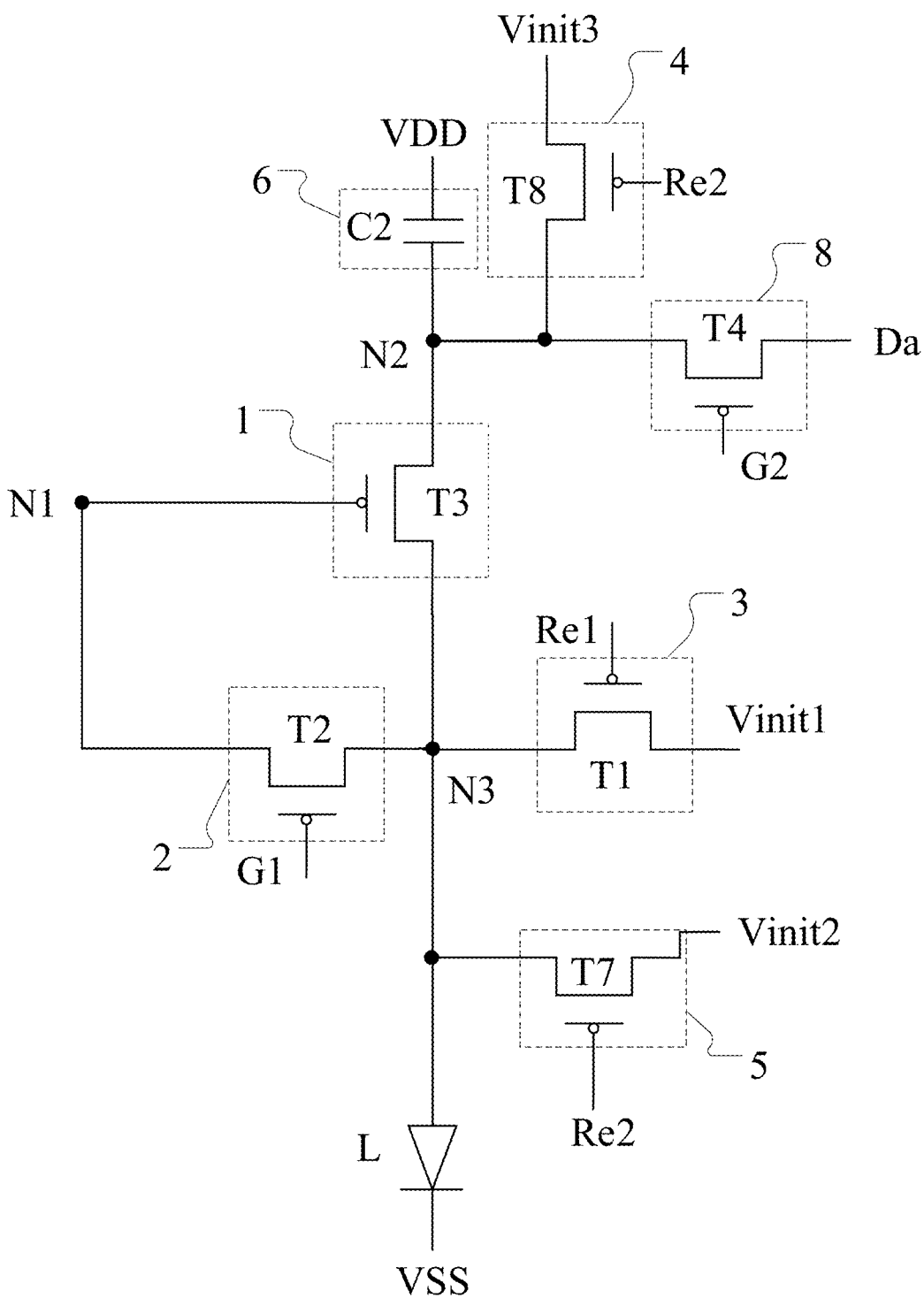
Figure 8:
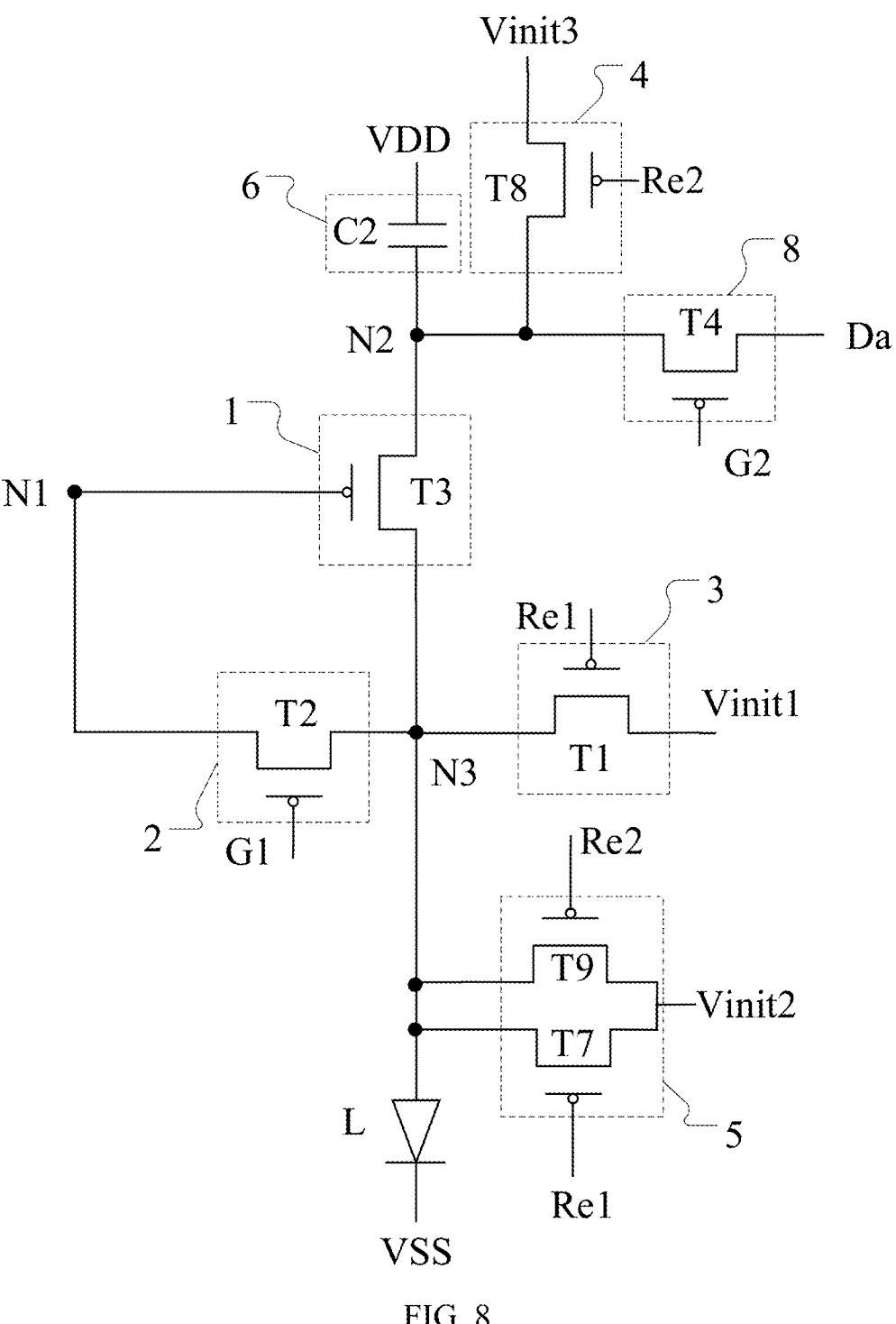

As shown in FIGS. 6-8, these are schematic diagrams of structures of pixel driving circuits according to other exemplary embodiments of the present disclosure. The setting of the second storage circuit 6 may also be applied to the display panel shown in FIGS. 2-4.

Figure 9:
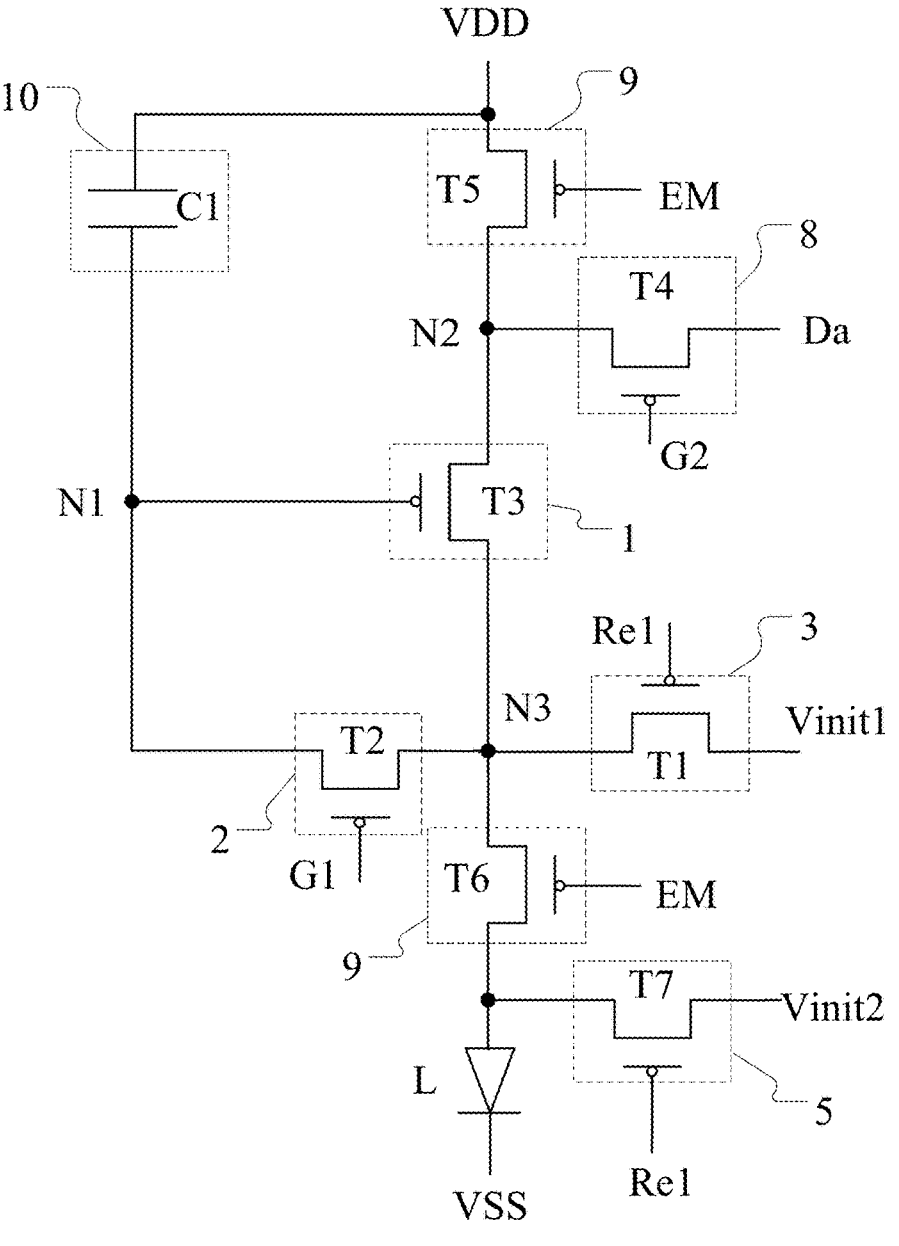
FIG. 9 is a schematic diagram of a structure of a pixel driving circuit according to another exemplary embodiment of the present disclosure.

As shown in FIG. 9, it is a schematic diagram of a structure of a pixel driving circuit according to another exemplary embodiment of the present disclosure. On the basis of the display panel shown in FIG. 1, the pixel driving circuit may further include: a second reset circuit 5, a data writing circuit 8, a light-emitting control circuit 9, and a first storage circuit 10. The second reset circuit 5 is configured to transmit a signal from the second initial signal terminal Vinit2 to the first electrode of the light-emitting unit L in response to a signal from the first reset signal terminal Re1, in order to reset the first electrode of the light-emitting unit. The data writing circuit 8 is connected to the second node N2, a data signal terminal Da, and a second gate drive signal terminal G2, and is configured to transmit a signal from the data signal terminal Da to the second node N2 in response to a signal from the second gate drive signal terminal G2. The light-emitting control circuit 9 is connected to a first power supply terminal VDD, the second node N2, the third node N3, a first electrode of a light-emitting unit L, and an enabling signal terminal EM, and is configured to connect the first power supply terminal VDD to the second node N2 in response to a signal from the enabling signal terminal EM, and to connect the third node N3 to the first electrode of the light-emitting unit L in response to the signal from the enabling signal terminal EM. The first storage circuit 10 is connected between the first node N1 and the first power supply terminal VDD. The second reset circuit 5 may include a seventh transistor T7. A first electrode of the seventh transistor T7 is connected to the second initial signal terminal Vinit2, a second electrode of the seventh transistor T7 is connected to the first electrode of the light-emitting unit L, and a gate of the seventh transistor T7 is connected to the first reset signal terminal Re1. The data writing circuit 8 may include a fourth transistor T4. A first electrode of the fourth transistor T4 is connected to the data signal terminal Da, a second electrode of the fourth transistor T4 is connected to the second node N2, and a gate of the fourth transistor T4 is connected to the second gate drive signal terminal G2. The light-emitting control circuit 9 may include a fifth transistor T5 and a sixth transistor T6. A first electrode of the fifth transistor T5 is connected to the first power supply terminal VDD, a second electrode of the fifth transistor T5 is connected to the second node N2, and a gate of the fifth transistor T5 is connected to the enabling signal terminal EM. A first electrode of the sixth transistor T6 is connected to the third node N3, a second electrode of the sixth transistor T6 is connected to the first electrode of the light-emitting unit L, and a gate of the sixth transistor T6 is connected to the enabling signal terminal EM. The first storage circuit 10 may include a first capacitor C1. The first capacitor C1 is connected between the first node N1 and the first power supply terminal VDD.

In this exemplary embodiment, the first transistor T1, the second transistor T2, the drive transistor T3, the fourth transistor T4, the fifth transistor T5, the sixth transistor T6, and the seventh transistor T7 may be P-type transistors. It is to be understood that in other exemplary embodiments, the first transistor T1, the second transistor T2, the fourth transistor T4, the fifth transistor T5, the sixth transistor T6, and the seventh transistor T7 may be N-type transistors.

Figure 10:
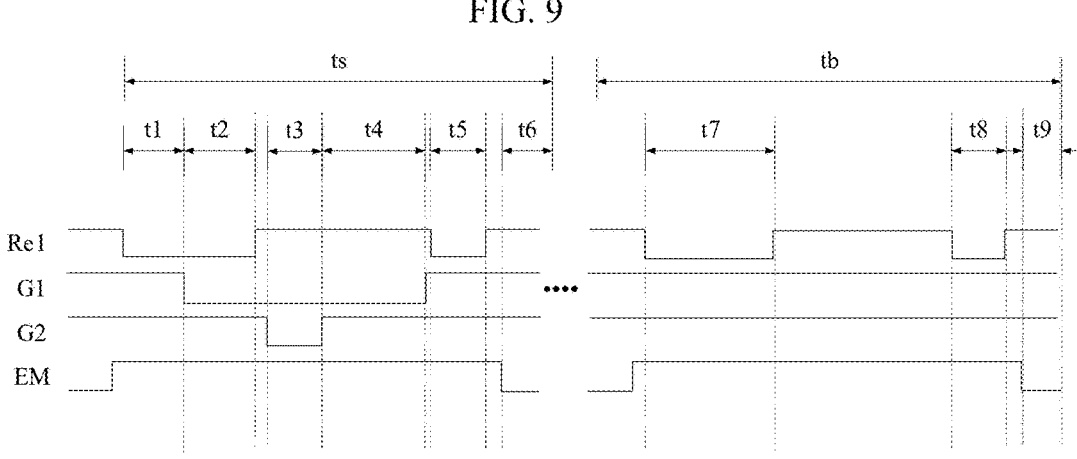
FIG. 10 is a timing diagram of signal terminals of the pixel driving circuit shown in FIG. 9 in a driving method.

As shown in FIG. 10, it is a timing diagram of signal terminals of the pixel driving circuit shown in FIG. 9 in a driving method, in which Re1 represents a timing diagram of a first reset signal terminal, G1 represents a timing diagram of a first gate drive signal terminal, G2 represents a timing diagram of a second gate drive signal terminal, and EM represents a timing diagram of an enabling signal terminal.

A scanning frame ts of the pixel driving circuit includes six phases, i.e., a first phase t1, a second phase t2, a third phase t3, a fourth phase t4, a fifth phase t5, and a sixth phase. In the first phase t1: the first reset signal terminal Re1 outputs a low-level signal, the first transistor T1 and the seventh transistor T7 are turned on, and the first initial signal terminal Vinit1 may input a high-level or low-level initial signal to the third node N3 to improve the hysteresis of the drive transistor T3. The input of the initial signal from the first initial signal terminal Vinit1 to the third node N3 may cause all screens to have the same voltage starting point when the compensation voltage is inputted to the first node N1 from the data signal terminal, so that the residual image problem that occurs when different screens are switched can be improved. The second initial signal terminal Vinit2 inputs a low-level initial signal to the first electrode of the light-emitting unit to reset the light-emitting unit. In the second phase t2: the first reset signal terminal Re1 and the first gate drive signal terminal G1 output a low-level signal, the first transistor T1, the second transistor T2, and the seventh transistor T7 are turned on, the first initial signal terminal Vinit1 inputs a low-level initial signal to the first node N1, the second node N2, and the third node N3, and the second initial signal terminal Vinit2 continuously inputs a low-level initial signal to the first electrode of the light-emitting unit to reset the light-emitting unit. In the third phase t3: the first gate drive signal terminal G1 and the second gate drive signal terminal G2 output low-level signals, the second transistor T2 and the fourth transistor T4 are turned on, and the data signal terminal Da outputs a data signal to input a compensation voltage Vdata+Vth to the first node N1, wherein Vdata is a voltage at the data signal terminal, and Vth is a threshold voltage of the drive transistor T3. In the fourth phase t4: the first gate drive signal terminal G1 outputs a low-level signal, the second transistor T2 is continuously turned on, and the second node N2 may continuously input a compensation voltage to the first node N1, so that the time for writing the compensation voltage to the first node N1 can be increased while the driving frequency remains unchanged. On the one hand, with the setting, the compensation voltage can be sufficiently written to the first node N1 to improve the brightness difference between pixel rows; on the other hand, this setting can further improve the hysteresis problem of the drive transistor T3; and on the yet another hand, the setting is favorable to the high-frequency design of the display panel. In a fifth phase t5: the first reset signal terminal Re1 outputs a low-level signal, the first transistor T1 and the seventh transistor T7 are turned on, and the first initial signal terminal Vinit1 may input a low-level initial signal to the third node N3 and the second node N2 again to improve the hysteresis problem of the drive transistor T3, and at the same time the second initial signal terminal Vinit2 may input a low-level initial signal again to the first electrode of the light-emitting unit. This setting can improve the flickering problem of the display panel during frequency switching. In the sixth phase t6: the enabling signal terminal EM outputs a low-level signal, the fifth transistor T5 and the sixth transistor T6 are turned on, and the drive transistor T3 provides a driving current to the light-emitting unit L under the action of the first node N1. According to the output current formula of the drive transistor, i.e., $I=(\mu WCox/2L)(Vgs-Vth)^2$, wherein u is the carrier mobility, Cox is the gate capacitance per unit area, W is the width of the channel of the drive transistor, L is the length of the channel of the drive transistor, Vgs is the voltage difference between the gate and the source of the drive transistor, and Vth is the threshold voltage of the drive transistor, the output current I of the drive transistor in the pixel driving circuit of the present disclosure is equal to $(\mu WCox/2L)(Vdata+Vth-Vdd-Vth)^2$. This pixel driving circuit can avoid the effect of the threshold value of the drive transistor on the output current of the drive transistor. A maintenance frame tb of the pixel driving circuit may include three phases, i.e., a seventh phase t7, an eighth phase t8, and a ninth phase t9. In the seventh phase t7 and the eighth phase t8, the first reset signal terminal Re1 outputs a low-level signal, the first transistor T1 and the seventh transistor T7 are turned on, and the first initial signal terminal Vinit1 inputs a low-level initial signal to the third node N3 and the second node N2 to improve the hysteresis of the drive transistor T3, and the second initial signal terminal Vinit2 inputs a low-level initial signal to the first electrode of the light-emitting unit to reset the light-emitting unit. In the ninth phase t9: the enabling signal terminal EM outputs a low-level signal, the fifth transistor T5 and the sixth transistor T6 are turned on, and the light-emitting unit emits light. The first initial signal terminal Vinit1 and the second initial signal terminal Vinit2 may output a DC low-level signal.

Figures 11, 12:
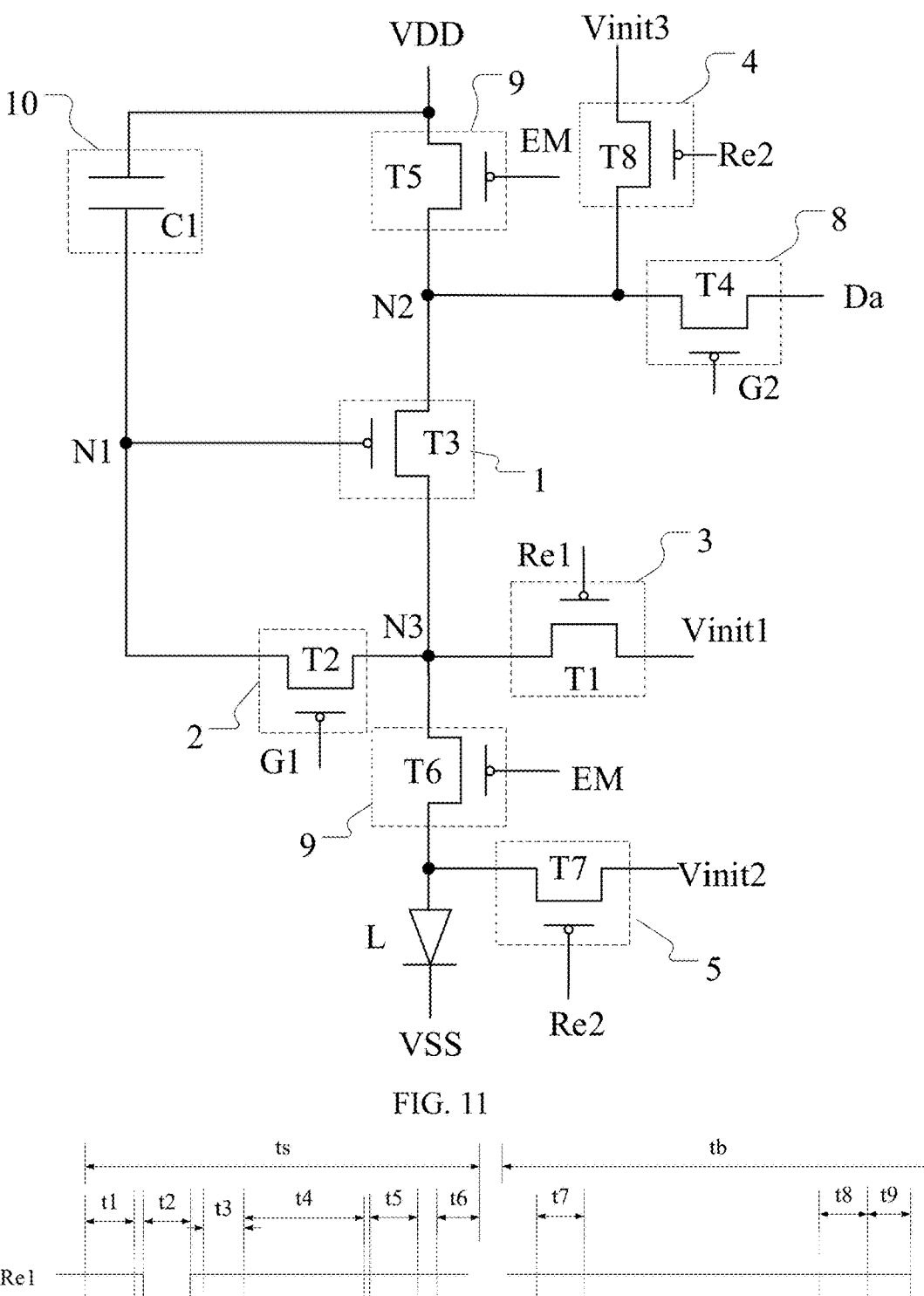
FIG. 11 is a schematic diagram of a structure of a pixel driving circuit according to another exemplary embodiment of the present disclosure.
FIG. 12 is a timing diagram of signal terminals of the pixel driving circuit shown in FIG. 11 in a driving method.

As shown in FIG. 11, it is a schematic diagram of a structure of a pixel driving circuit according to another exemplary embodiment of the present disclosure. On the basis of the display panel shown in FIG. 3, the pixel driving circuit may further include: a data writing circuit 8, a light-emitting control circuit 9, and a first storage circuit 10. The data writing circuit 8 is connected to the second node N2, a data signal terminal Da, and a second gate drive signal terminal G2, and is configured to transmit a signal from the data signal terminal Da to the second node N2 in response to a signal from the second gate drive signal terminal G2. The light-emitting control circuit 9 is connected to a first power supply terminal VDD, the second node N2, the third node N3, a first electrode of a light-emitting unit L, and an enabling signal terminal EM, and is configured to connect the first power supply terminal VDD to the second node N2 in response to a signal from the enabling signal terminal EM, and to connect the third node N3 to the first electrode of the light-emitting unit L in response to the signal from the enabling signal terminal EM. The first storage circuit 10 is connected between the first node N1 and the first power supply terminal VDD. The data writing circuit 8 may include a fourth transistor T4. A first electrode of the fourth transistor T4 is connected to the data signal terminal Da, a second electrode of the fourth transistor T4 is connected to the second node N2, and a gate of the fourth transistor T4 is connected to the second gate drive signal terminal G2. The light-emitting control circuit 9 may include a fifth transistor T5 and a sixth transistor T6. A first electrode of the fifth transistor T5 is connected to the first power supply terminal VDD, a second electrode of the fifth transistor T5 is connected to the second node N2, a gate of the fifth transistor T5 is connected to the enabling signal terminal EM. A first electrode of the sixth transistor T6 is connected to the third node N3, a second electrode of the sixth transistor T6 is connected to the first electrode of the light-emitting unit L, and a gate of the sixth transistor T6 is connected to the enabling signal terminal EM. The first storage circuit 10 may include a first capacitor C1. The first capacitor C1 is connected between the first node N1 and the first power supply terminal VDD.

The data writing circuit 8 may include a fourth transistor T4. A first electrode of the fourth transistor T4 is connected to the data signal terminal Da, a second electrode of the fourth transistor T4 is connected to the second node N2, and a gate of the fourth transistor T4 is connected to the second gate drive signal terminal G2. The light-emitting control circuit 9 may include a fifth transistor T5 and a sixth transistor T6. A first electrode of the fifth transistor T5 is connected to the first power supply terminal VDD, a second electrode of the fifth transistor T5 is connected to the second node N2, a gate of the fifth transistor T5 is connected to the enabling signal terminal EM. A first electrode of the sixth transistor T6 is connected to the third node N3, a second electrode of the sixth transistor T6 is connected to the first electrode of the light-emitting unit L, and a gate of the sixth transistor T6 is connected to the enabling signal terminal EM. The first storage circuit 10 may include a first capacitor C1. The first capacitor C1 is connected between the first node N1 and the first power supply terminal VDD.

In this exemplary embodiment, the first transistor T1, the second transistor T2, the drive transistor T3, the fourth transistor T4, the fifth transistor T5, the sixth transistor T6, and the seventh transistor T7 may be P-type transistors. It is to be understood that in other exemplary embodiments, the first transistor T1, the second transistor T2, the fourth transistor T4, the fifth transistor T5, the sixth transistor T6, and the seventh transistor T7 may be N-type transistors.

As shown in FIG. 12, it is a timing diagram of signal terminals of the pixel driving circuit shown in FIG. 11 in a driving method, in which Re1 represents a timing diagram of a first reset signal terminal, Re2 represents a timing diagram of a second reset signal terminal, G1 represents a timing diagram of a first gate drive signal terminal, G2 represents a timing diagram of a second gate drive signal terminal, and EM represents a timing diagram of an enabling signal terminal.

A scanning frame ts of this pixel driving circuit includes six phases, i.e., a first phase t1, a second phase t2, a third phase t3, a fourth phase t4, a fifth phase t5, and a sixth phase.

In the first phase t1: the second reset signal terminal Re2 outputs a low-level signal, the eighth transistor T8 is turned on, the third initial signal terminal Vinit3 inputs a high-level or a low-level initial signal to the second node N2 to improve the hysteresis of the drive transistor T3, and the second initial signal terminal Vinit2 inputs a low-level initial signal to the first electrode of the light-emitting unit to reset the light-emitting unit. In the second phase t2: the first reset signal terminal Re1 and the first gate drive signal terminal G1 output low-level signals, the first transistor T1 and the second transistor T2 are turned on, and the first initial signal terminal Vinit1 inputs a low-level initial signal to the first node N1, the second node N2, and the third node N3. In the third phase t3: the first gate drive signal terminal G1 and the second gate drive signal terminal G2 output low-level signals, the second transistor T2 and the fourth transistor T4 are turned on, and the data signal terminal Da outputs a data signal to input a compensation voltage Vdata+Vth to the first node N1, wherein Vdata is a voltage at the data signal terminal, and Vth is a threshold voltage of the drive transistor T3. In the fourth phase t4: the first gate drive signal terminal G1 outputs a low-level signal, the second transistor T2 is continuously turned on, and the second node N2 may continuously input the compensation voltage to the first node N1, so that the time for writing the compensation voltage to the first node N1 may be increased while the driving frequency remains unchanged. On the one hand, with the setting, the compensation voltage can be sufficiently written to the first node N1 to improve the brightness difference between pixel rows; on the other hand, this setting can further improve the hysteresis problem of the drive transistor T3; and on the yet another hand, the setting is favorable to the high-frequency design of the display panel. In the fifth phase t5: the second reset signal terminal Re2 outputs a low-level signal, the eighth transistor T8 is turned on, and the third initial signal terminal Vinit3 may input a low-level or high-level initial signal to the third node N3 and the second node N2 again to improve the hysteresis problem of the drive transistor T3, and at the same time, the second initial signal terminal Vinit2 may input a low-level initial signal to the first electrode of the light-emitting unit again. This setting can improve the flickering problem of the display panel during frequency switching. In the sixth phase t6: the enabling signal terminal EM outputs a low-level signal, the fifth transistor T5 and the sixth transistor T6 are turned on, and the drive transistor T3 provides a driving current to the light-emitting unit L under the action of the first node N1.

A maintenance frame tb of the pixel driving circuit may include three phases, i.e., a seventh phase t7, an eighth phase t8, and a ninth phase t9. In the seventh phase t7 and the eighth phase t8, the second reset signal terminal Re2 outputs a low-level signal, the eighth transistor T8 is turned on, the first initial signal terminal Vinit1 inputs a low-level or high-level initial signal to the third node N3 and the second node N2 to improve the hysteresis of the drive transistor T3, and the second initial signal terminal Vinit2 inputs a low-level initial signal to the first electrode of the light-emitting unit to reset the light-emitting unit. In the ninth phase t9: the enabling signal terminal EM outputs a low-level signal, the fifth transistor T5 and the sixth transistor T6 are turned on, and the light-emitting unit emits light. The first initial signal terminal Vinit1, the second initial signal terminal Vinit2, and the third initial signal terminal may output a DC low-level signal.

In this exemplary embodiment, the first reset signal terminal Re1 and the second gate drive signal terminal G2 may be provided with drive signals by the same gate driving circuit, wherein the first reset signal terminal Re1 and the second gate drive signal terminal G2 in the same pixel driving circuit are connected to outputs of different shift register units in the gate driving circuit.

Figure 13:
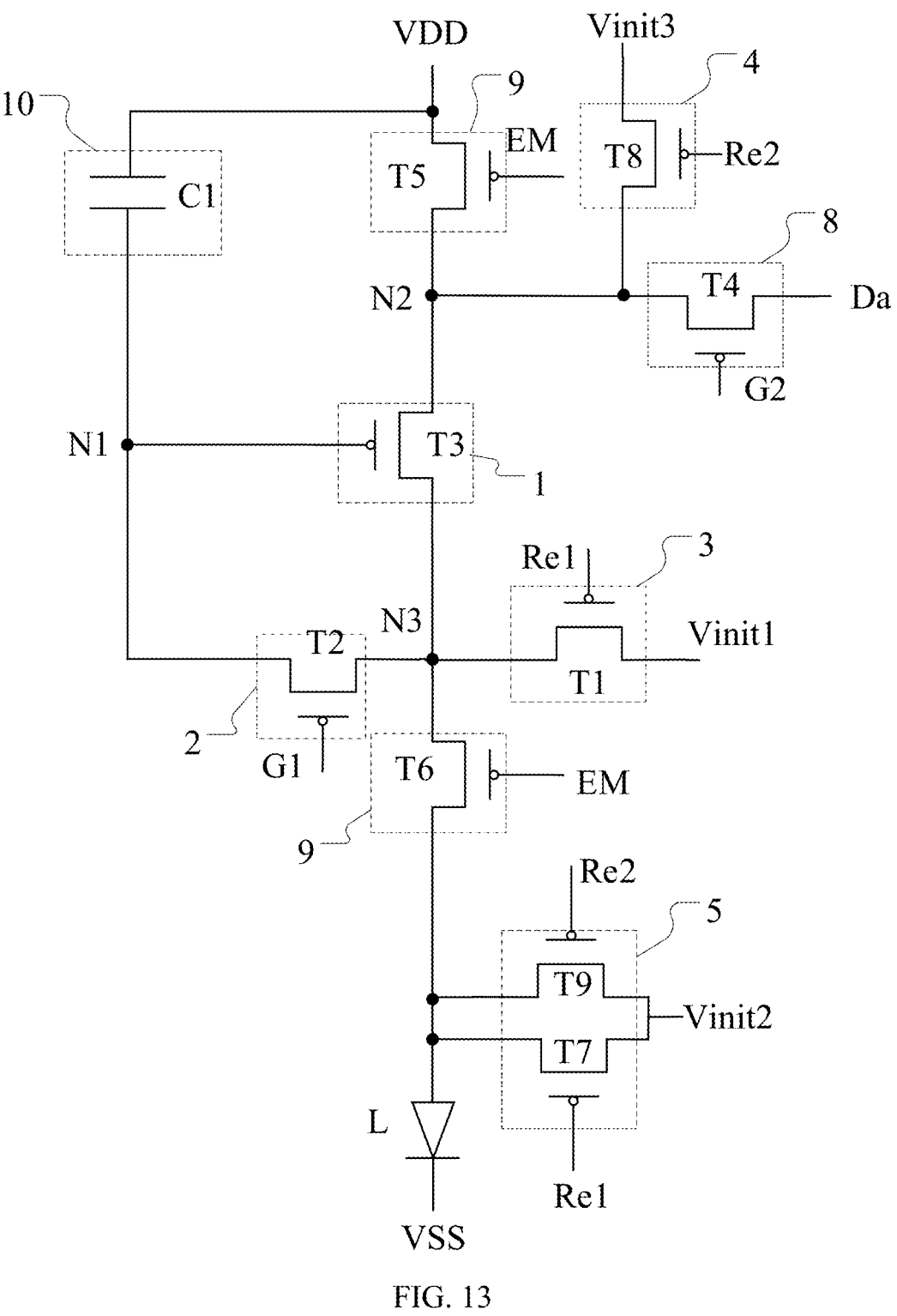
FIG. 13 is a schematic diagram of a structure of a pixel driving circuit according to another exemplary embodiment of the present disclosure.

As shown in FIG. 13, it is a schematic diagram of a structure of a pixel driving circuit according to another exemplary embodiment of the present disclosure. On the basis of the display panel shown in FIG. 4, the pixel driving circuit may further include: a data writing circuit 8, a light-emitting control circuit 9, and a first storage circuit 10. The driving method of this pixel driving circuit may be the same as the driving method of the pixel driving circuit shown in FIG. 11.

Figure 14:
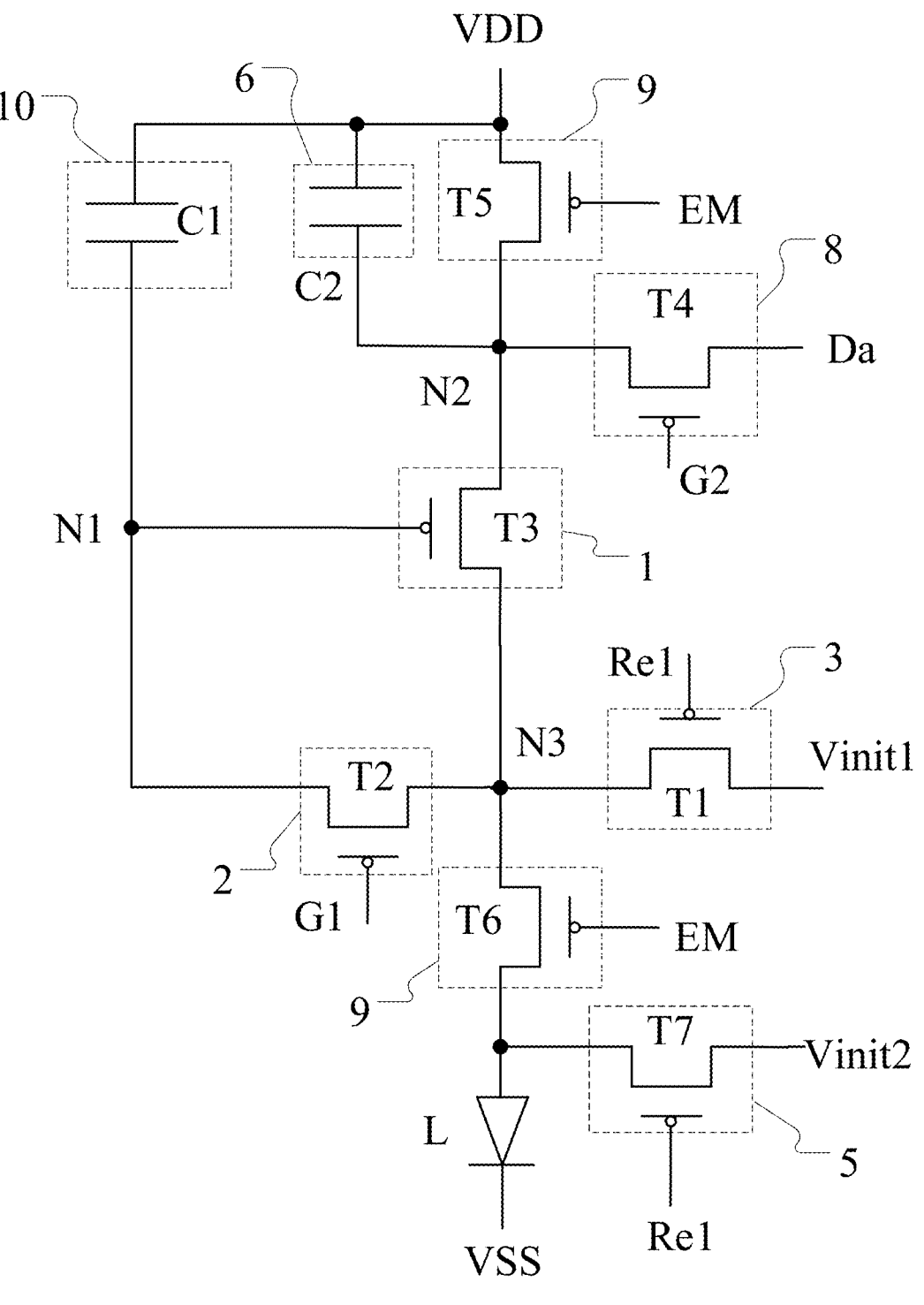
FIGS. 14-16 are schematic diagrams of structures of pixel driving circuits according to other exemplary embodiments of the present disclosure.
Figure 15:
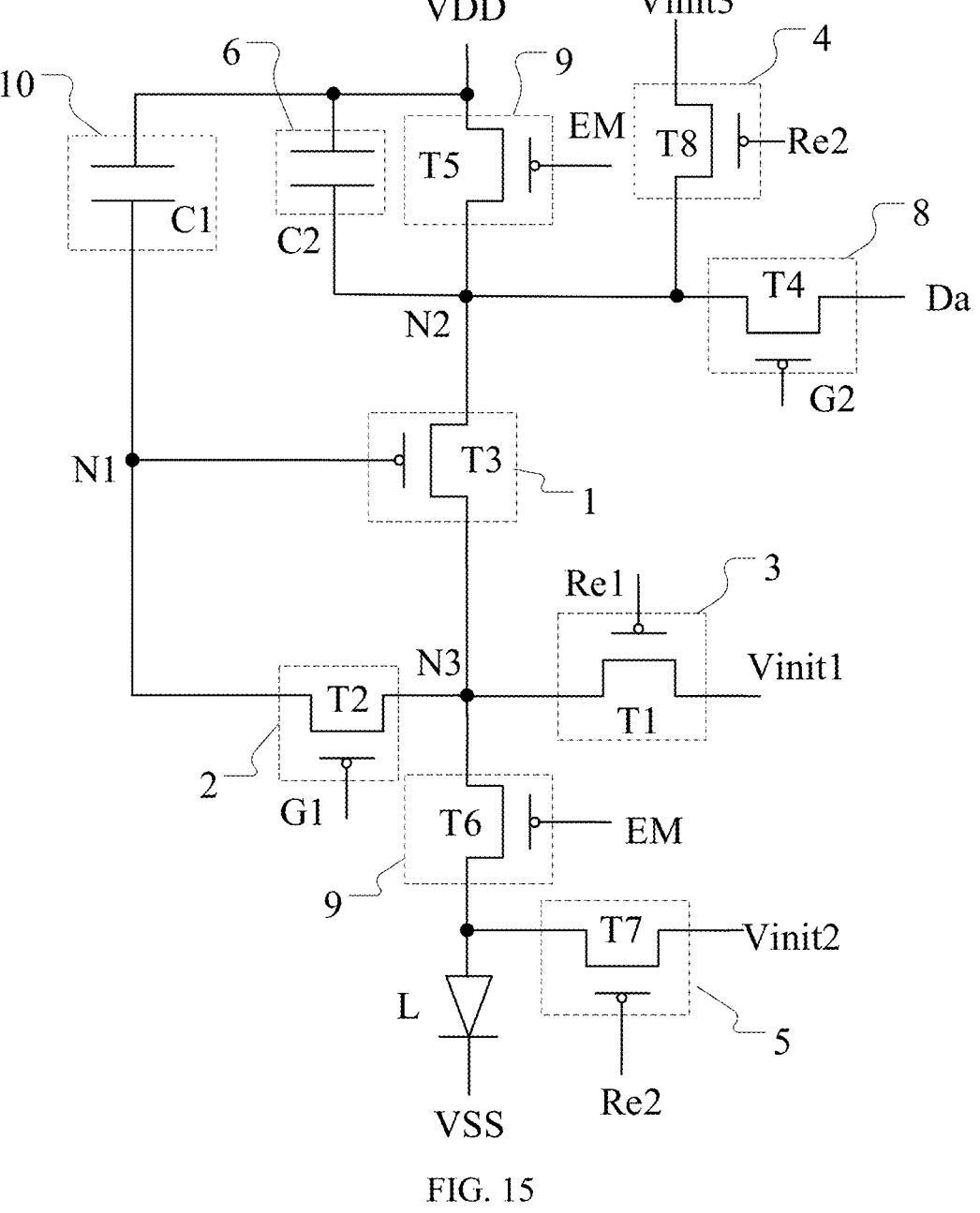
Figure 16:
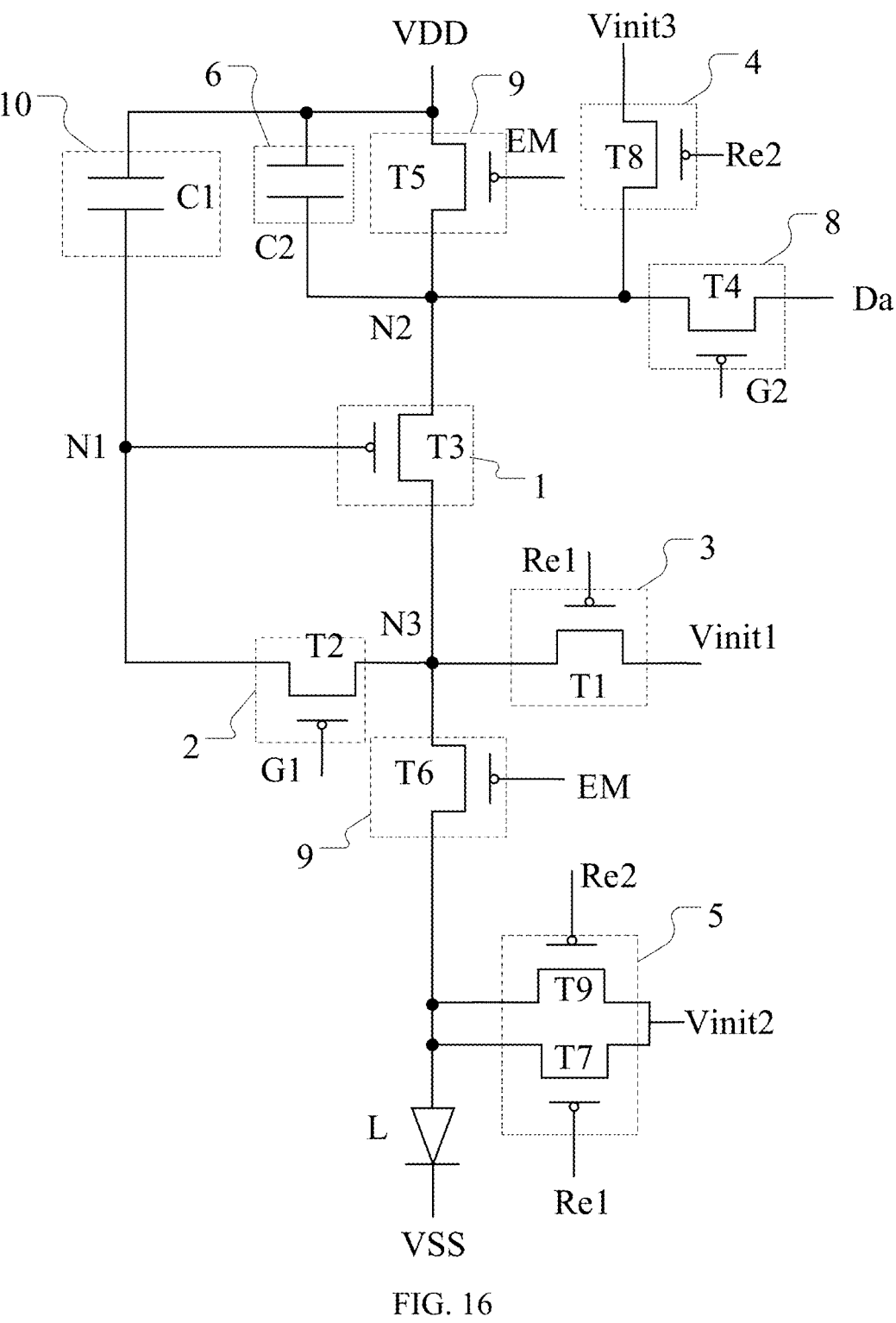

As shown in FIGS. 14-16, these are schematic diagrams of structures of pixel driving circuits according to other exemplary embodiments of the present disclosure. On the basis of the pixel driving circuits shown in FIGS. 9, 11, and 13, the pixel driving circuits may be provided with a second storage circuit 6.

Figure 17A:
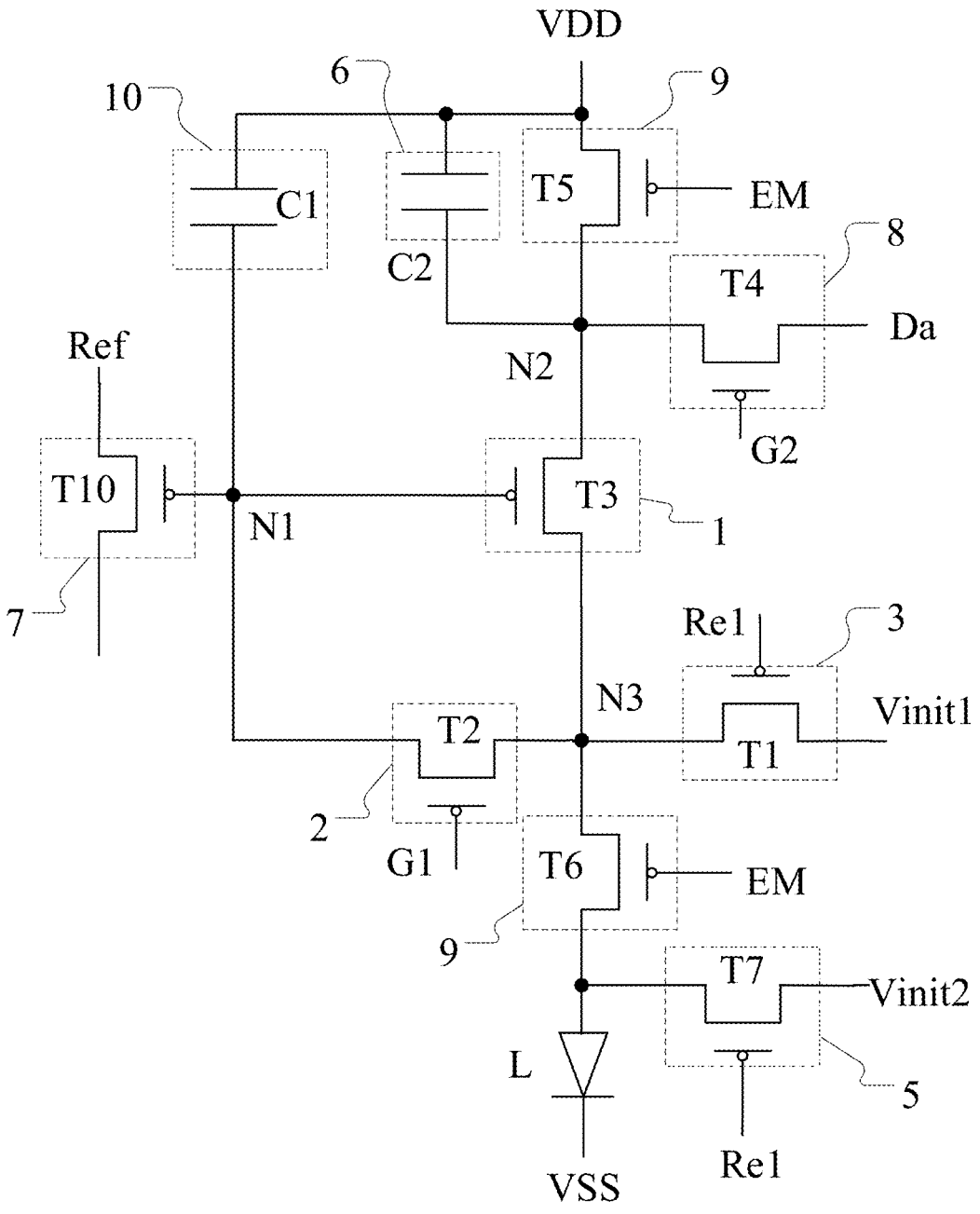
FIG. 17a is a schematic diagram of a structure of a pixel driving circuit according to another exemplary embodiment of the present disclosure.

As shown in FIG. 17a, it is a schematic diagram of a structure of a pixel driving circuit according to another exemplary embodiment of the present disclosure. On the basis of the pixel driving circuit shown in FIG. 14, the pixel driving circuit may further include a second compensation circuit 7. The second compensation circuit 7 may be connected to the first node N1 and a reference signal terminal Ref and is configured to transmit a signal from the reference signal terminal Ref to the first node N1. As shown in FIG. 17a, the second compensation circuit 7 may include a tenth transistor T10. A first electrode of the tenth transistor T10 is connected to the reference signal terminal Ref, a gate of the tenth transistor T10 is connected to the first node N1, and a second electrode of the tenth transistor T10 is left unconnected.

In this exemplary embodiment, voltage compensation can be applied to the first node N1 through the reference signal terminal Ref, in order to offset the voltage fluctuations caused by leakage at the first node N1. In this case, the amount of charge compensated by the reference signal terminal Ref to the first node N1 may be adjusted by controlling a magnitude of the voltage of the reference signal terminal Ref.

Figure 17B:
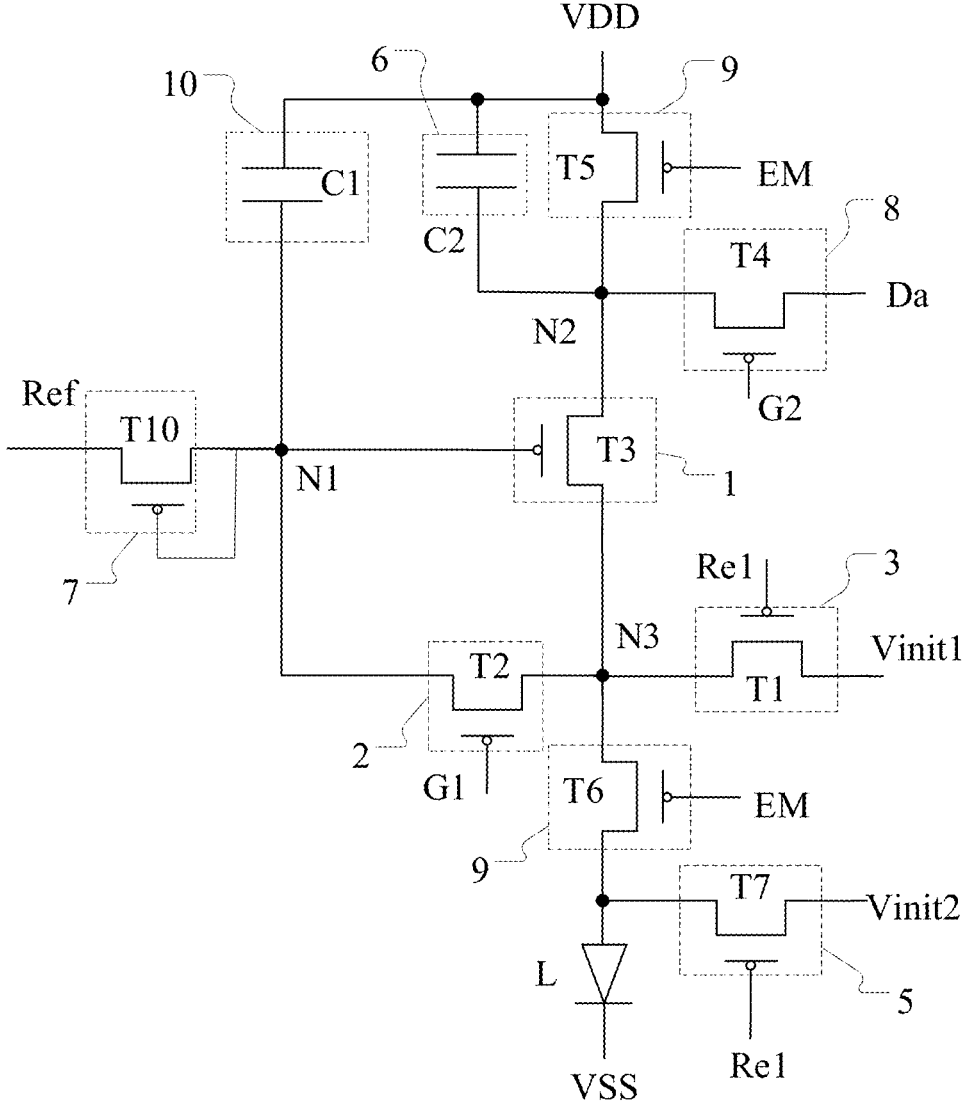
FIG. 17b is a schematic diagram of a structure of a pixel driving circuit according to another exemplary embodiment of the present disclosure.
Figure 17C:
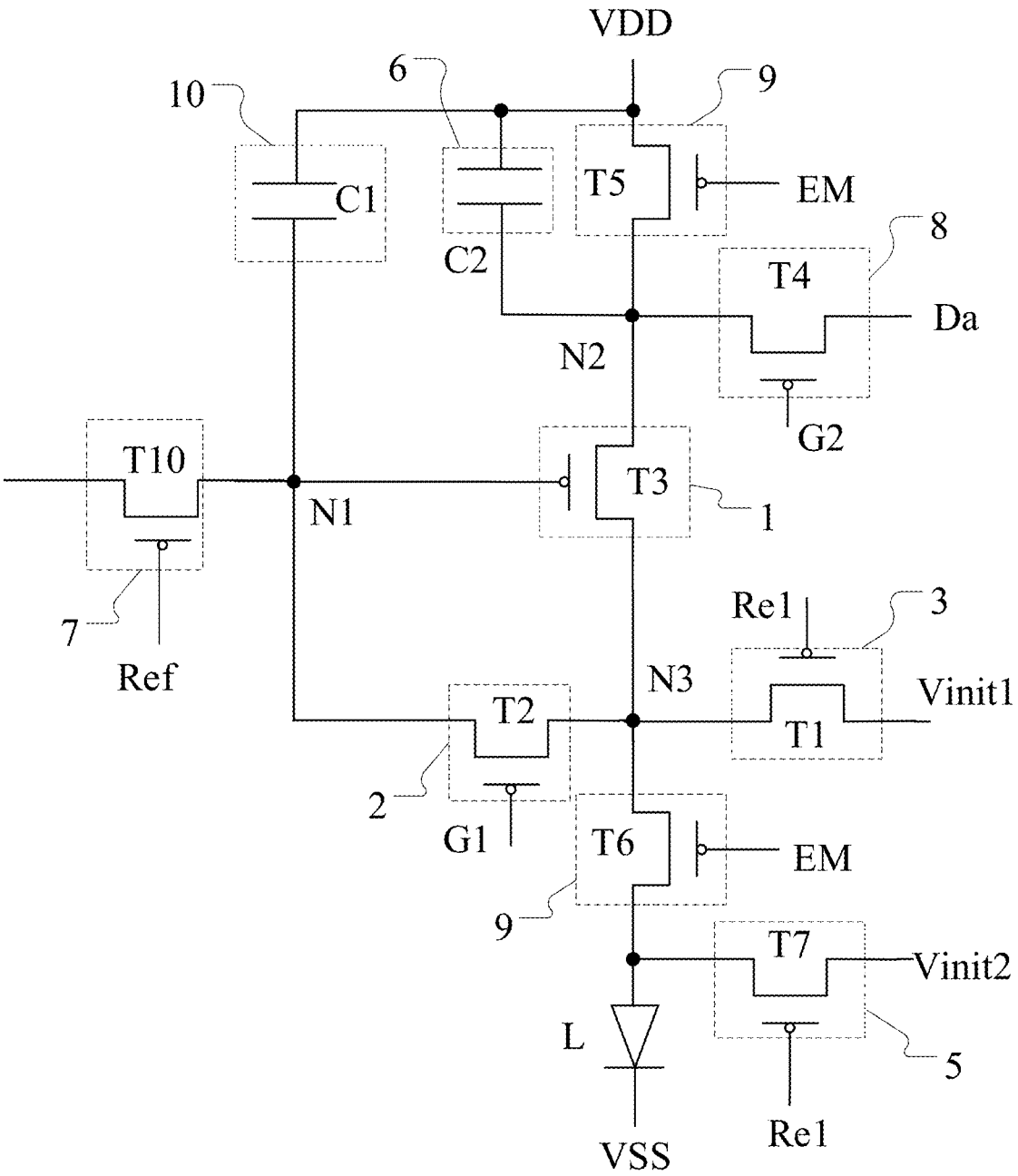
FIG. 17c is a schematic diagram of a structure of a pixel driving circuit according to another exemplary embodiment of the present disclosure.

It is to be understood that as shown in FIG. 17b, which is a schematic diagram of a structure of a pixel driving circuit according to another exemplary embodiment of the present disclosure, the first electrode of the tenth transistor T10 in the second compensation circuit 7 may be connected to the first node N1, the second electrode of the tenth transistor T10 is connected to the reference signal terminal Ref, and the gate of the tenth transistor T10 is connected to the first node N1. As shown in FIG. 17c, which is a schematic diagram of a structure of a pixel driving circuit according to another exemplary embodiment of the present disclosure, the first electrode of the tenth transistor T10 in the second compensation circuit 7 may be connected to the first node N1, the gate of the tenth transistor T10 is connected to the reference signal terminal Ref, and the second electrode of the tenth transistor T10 is left unconnected. The level of the reference signal terminal Ref may be any one of: a high level, a low level, or a variable level. The second compensation circuit 7 may also be changed from being connected to the first node N1 to being connected to the second node N2 or the third node N3, so that voltage compensation can be applied to the first node N1 through the second node N2 or the third node N3. The second compensation circuit 7 may also be added to the pixel driving circuit shown in FIGS. 1-13, 15, and 16.

Figure 21:
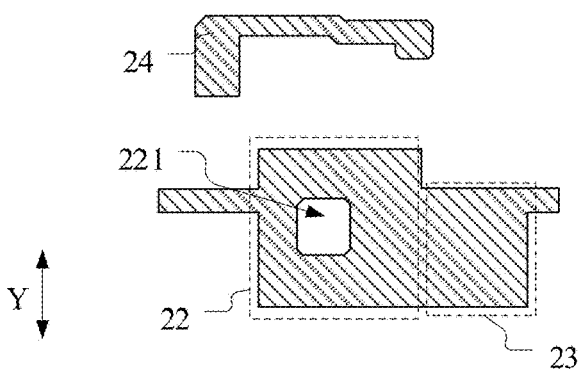
FIG. 21 is a structural layout of a second conductive layer in FIG. 18.
Figure 21:
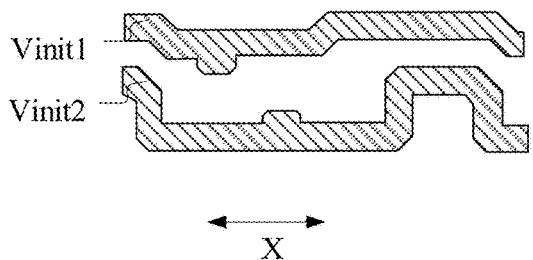
Figure 22:
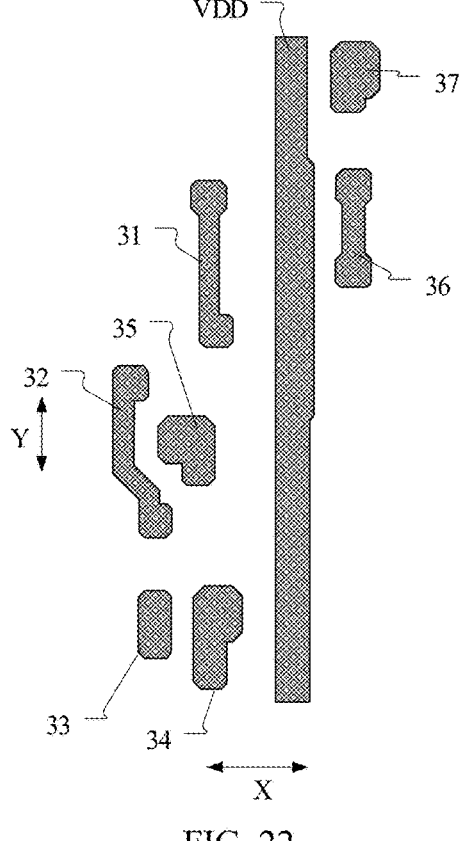
FIG. 22 is a structural layout of a third conductive layer in FIG. 18.
Figure 23:
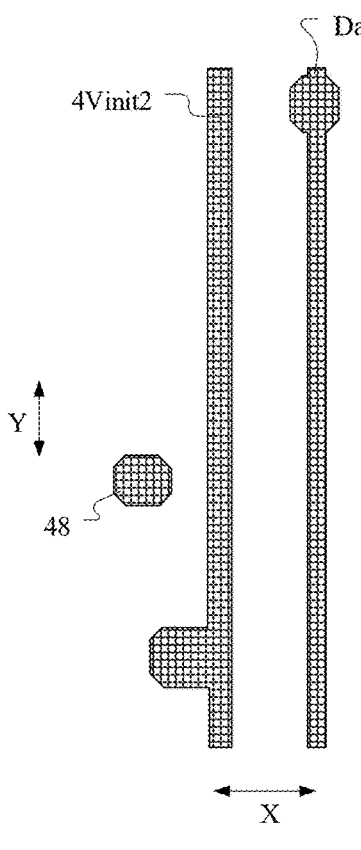
FIG. 23 is a structural layout of a fourth conductive layer in FIG. 18.
Figure 24:
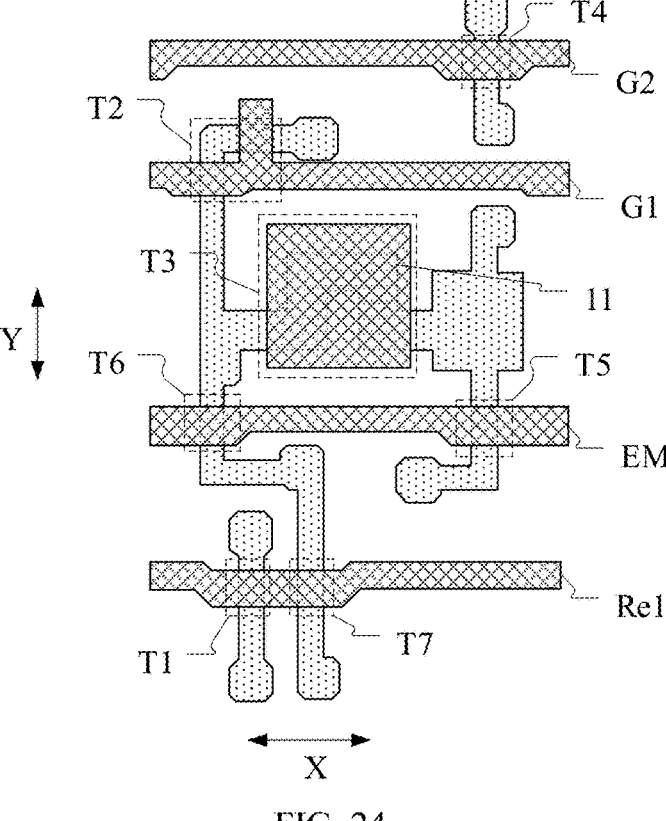
FIG. 24 is a structural layout of the active layer and the first conductive layer in FIG. 18.
Figure 25:
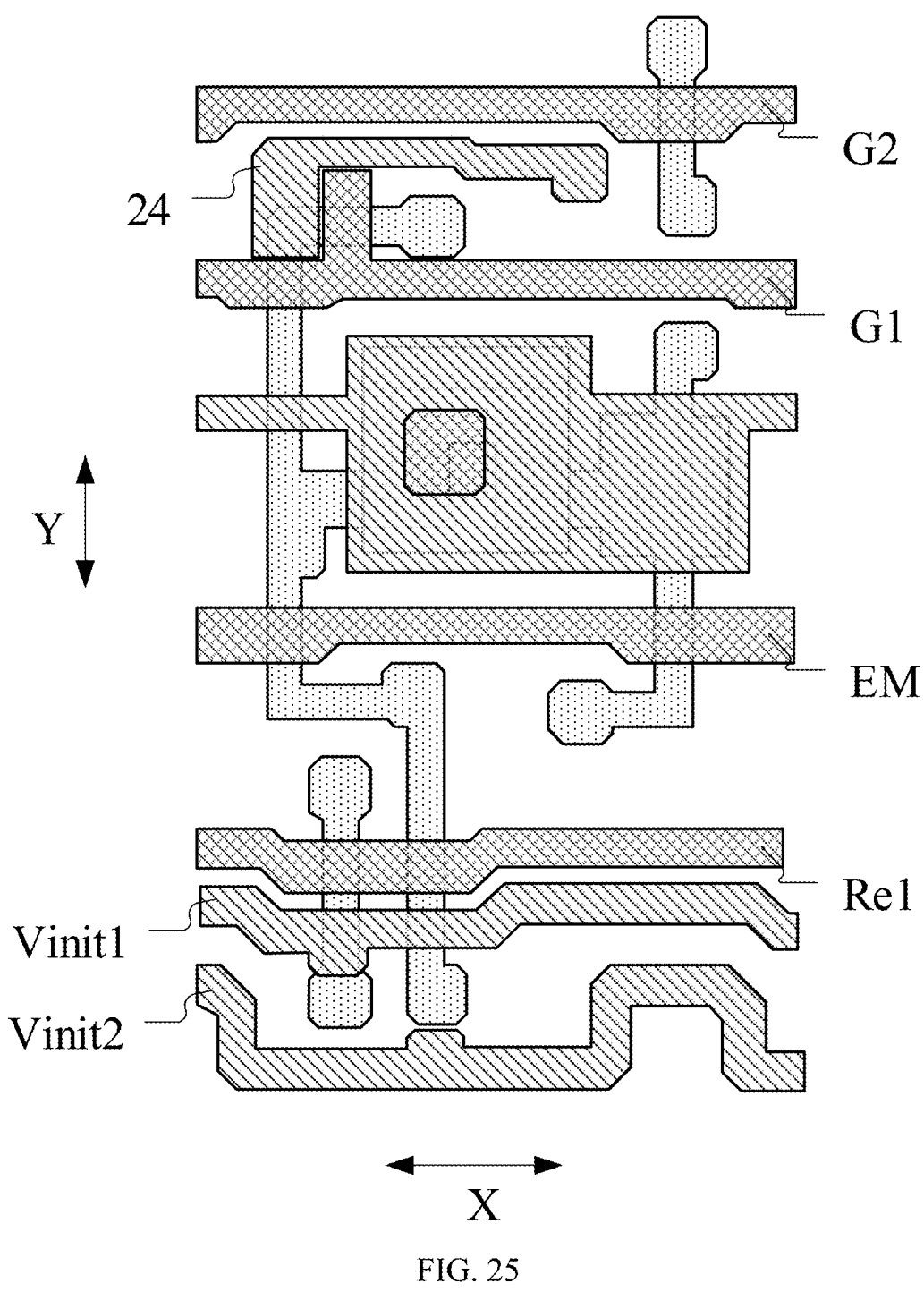
FIG. 25 is a structural layout of the active layer, the first conductive layer, and the second conductive layer in FIG. 18.
Figure 26:
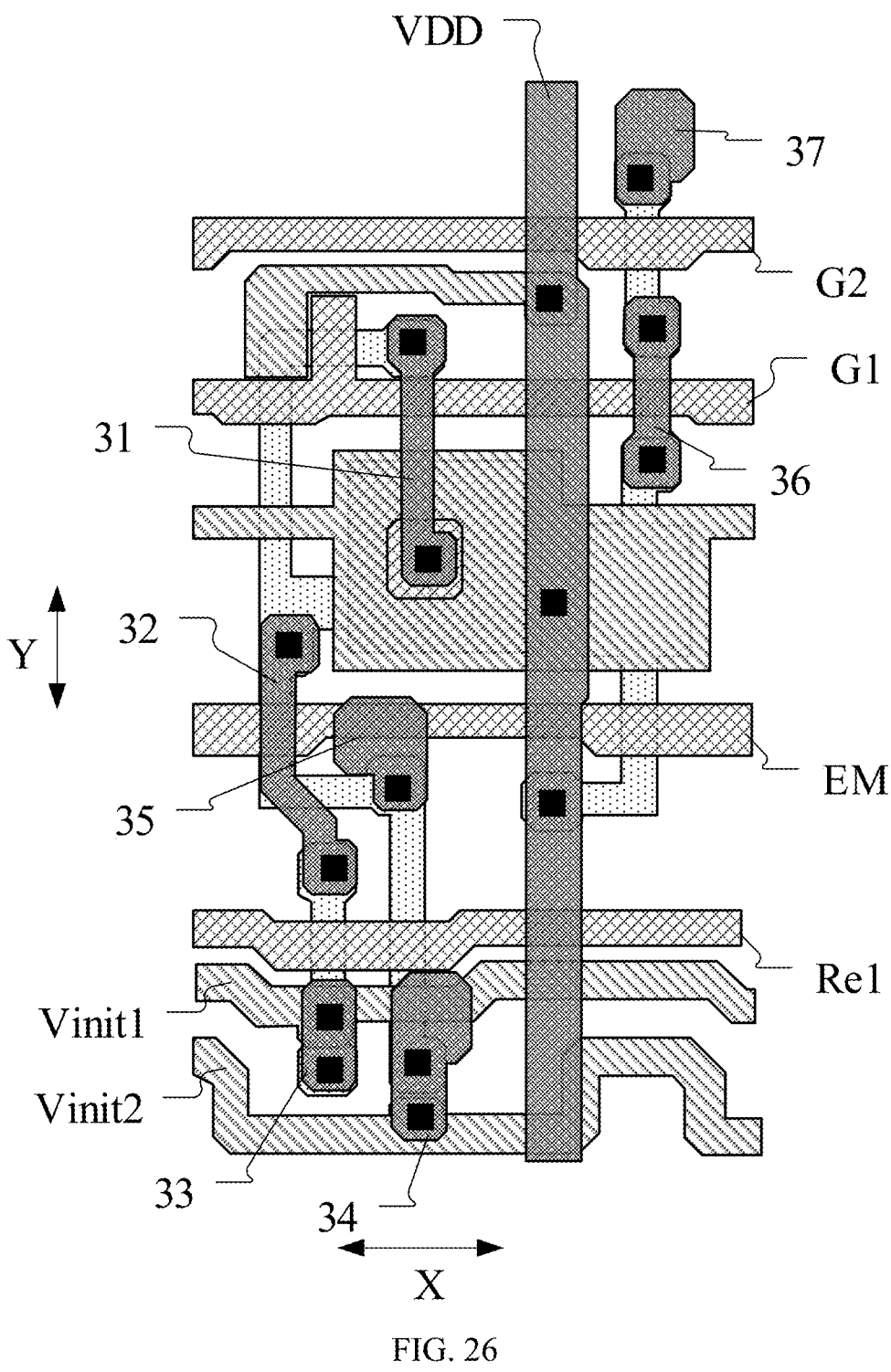
FIG. 26 is a structural layout of the active layer, the first conductive layer, the second conductive layer, and the third conductive layer in FIG. 18.

An exemplary embodiment further provides a display panel that may include a plurality of pixel driving circuits shown in FIG. 14. In this exemplary embodiment, the display panel may further include a base substrate, an active layer, a first conductive layer, a second conductive layer, a third conductive layer, a fourth conductive layer that are stacked in sequence, and an insulating layer may be disposed between the above structural layers. As shown in FIGS. 18-26, FIG. 18 is a structural layout of a display panel according to another exemplary embodiment of the present disclosure; FIG. 19 is a structural layout of an active layer in FIG. 18; FIG. 20 is a structural layout of a first conductive layer in FIG. 18; FIG. 21 is a structural layout of a second conductive layer in FIG. 18; FIG. 22 is a structural layout of a third conductive layer in FIG. 18; FIG. 23 is a structural layout of a fourth conductive layer in FIG. 18; FIG. 24 is a structural layout of the active layer and the first conductive layer in FIG. 18; FIG. 25 is a structural layout of the active layer, the first conductive layer, and the second conductive layer in FIG. 18; and FIG. 26 is a structural layout of the active layer, the first conductive layer, the second conductive layer, and the third conductive layer in FIG. 18.

Figure 18:
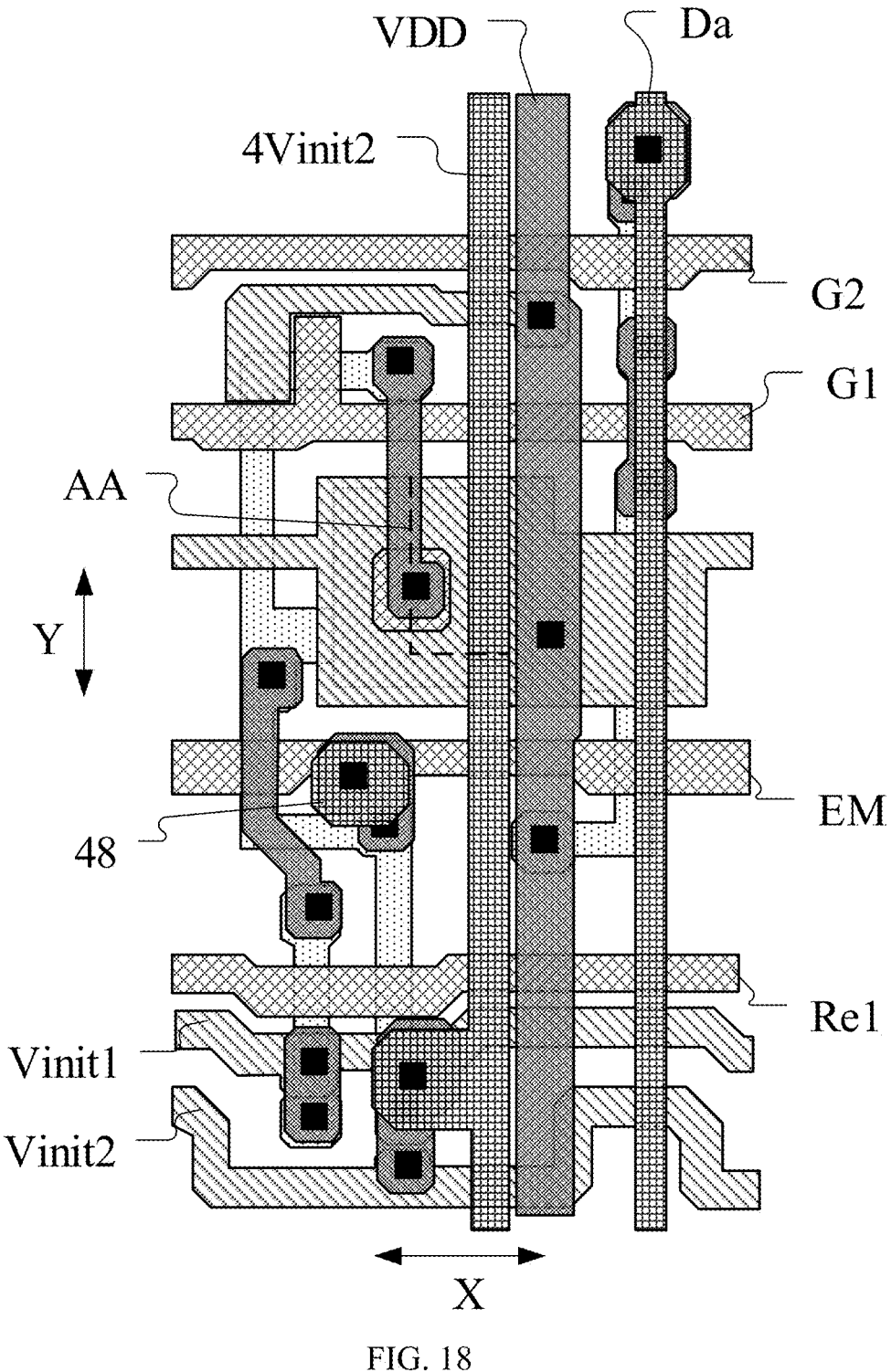
FIG. 18 is a structural layout of a display panel according to another exemplary embodiment of the present disclosure.
Figures 19, 20:
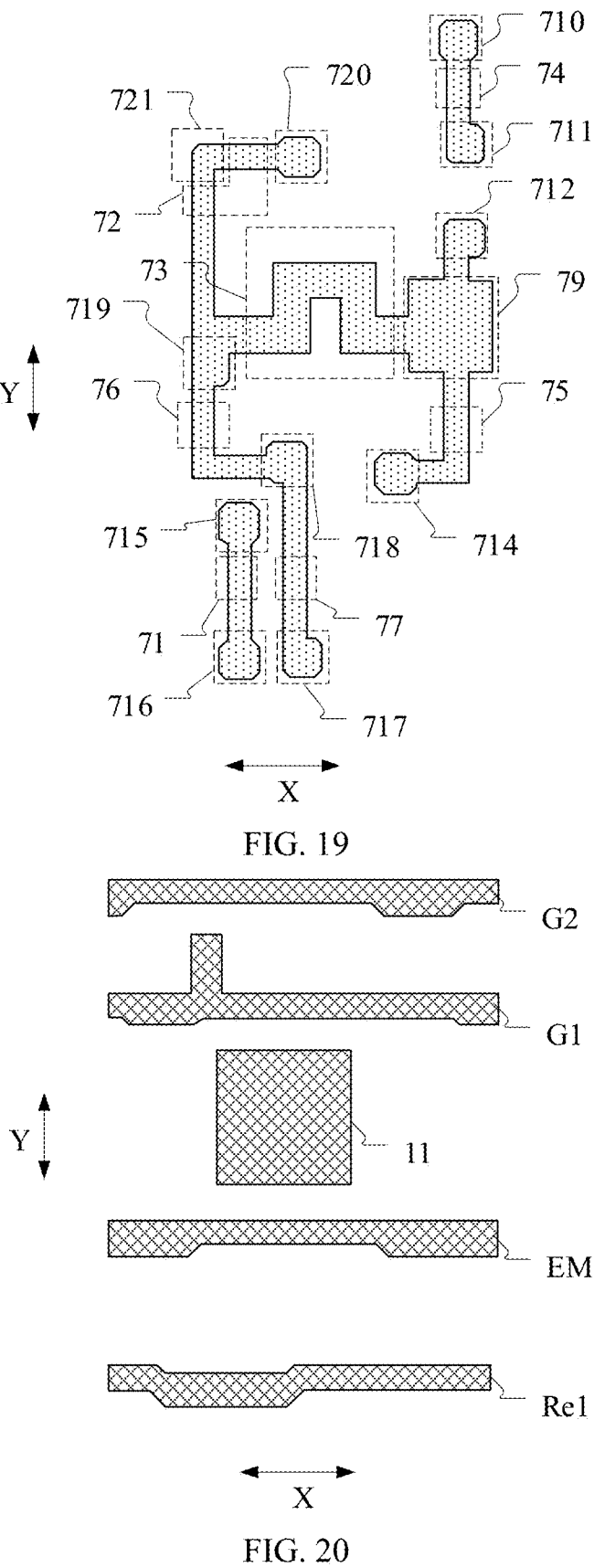
FIG. 19 is a structural layout of an active layer in FIG. 18.
FIG. 20 is a structural layout of a first conductive layer in FIG. 18.

As shown in FIGS. 18, 19, and 24, the active layer may include a first active portion 71, a second active portion 72, a third active portion 73, a fourth active portion 74, a fifth active portion 75, a sixth active portion 76, and a seventh active portion 77. The first active portion 71 is used to form a channel region for the first transistor T1, the second active portion 72 is used to form a channel region for the second transistor T2, the third active portion 73 is used to form a channel region for a drive transistor T3, the fourth active portion 74 is used to form a channel region for the fourth transistor T4, the fifth active portion 75 is used to form a channel region for the fifth transistor T5, the sixth active portion 76 is used to form a channel region for the sixth transistor T6, and the seventh active portion 77 is used to form a channel region for the seventh transistor T7. The active layer may also include a ninth active portion 79, a tenth active portion 710, an eleventh active portion 711, a twelfth active portion 712, a fourteenth active portion 714, a fifteenth active portion 715, a sixteenth active portion 716, a seventeenth active portion 717, an eighteenth active portion 718, a nineteenth active portion 719, a twentieth active portion 720, and a twenty-first active portion 721. The ninth active portion 79 is connected between the third active portion 73 and the fifth active portion 75. The tenth active portion 710 and the eleventh active portion 711 are connected to two ends of the fourth active portion 74. The twelfth active portion 712 is connected to an end of the ninth active portion 79 that is away from the fifth active portion 75. The fourteenth active portion 714 is connected to an end of the fifth active portion 75 that is away from the ninth active portion 79. The fifteenth active portion 715 and the sixteenth active portion 716 are connected to two ends of the first active portion 71. The seventeenth active portion 717 and the eighteenth active portion 718 are connected to two ends of the seventh active portion 77. The nineteenth active portion 719 is connected between the sixth active portion 76 and the third active portion 73. The twentieth active portion 720 is connected to an end of the second active portion 72 that is away from the third active portion 73. The twenty-first active portion 721 is connected between the dual channels of the second transistor. The active layer may be formed from a polysilicon material, and accordingly, the first transistor T1, the second transistor T2, the drive transistor T3, the fourth transistor T4, the fifth transistor T5, the sixth transistor T6, and the seventh transistor T7 may be P-type low-temperature polycrystalline silicon thin-film transistors.

As shown in FIGS. 18, 20, and 24, the first conductive layer may include: a first reset signal line Re1, a first gate line G1, a second gate line G2, an enabling signal line EM, and a first conductive portion 11. The first reset signal line Re1 is used to provide the first reset signal terminal in FIG. 14. The first gate line G1 is used to provide the first gate drive signal terminal in FIG. 14. The second gate line G2 is used to provide the second gate drive signal terminal in FIG. 14. The enabling signal line EM is used to provide the enabling signal terminal in FIG. 14. An orthographic projection of the first reset signal line Re1 on the base substrate may extend along the first direction X and cover orthographic projections of the first active portion 71 and the seventh active portion 77 on the base substrate, and a portion of the structure of the first reset signal line Re1 is used to form the gates of the first transistor T1 and the seventh transistor T7, respectively. An orthographic projection of the first gate line G1 on the base substrate may extend in the first direction X and cover an orthographic projection of the second active portion 72 on the base substrate, and a portion of the structure of the first gate line G1 is used to form the gate of the second transistor T2. An orthographic projection of the second gate line G2 on the base substrate may extend in the first direction X and cover an orthographic projection of the fourth active portion 74 on the base substrate, and a portion of the structure of the second gate line G2 is used to form the gate of the fourth transistor T4. An orthographic projection of the enabling signal line EM on the base substrate may extend in the first direction X and cover orthographic projections of the fifth active portion 75 and the sixth active portion 76 on the base substrate, and a portion of the structure of the enabling signal line EM is used to form the gates of the fifth transistor T5 and the sixth transistor T6, respectively. An orthographic projection of the first conductive portion 11 on the base substrate covers an orthographic projection of the third active portion 73 on the base substrate, and the first conductive portion 11 is used to form the gate of the drive transistor T3 and the first electrode of the first capacitor C1. In addition, in the display panel, the first conductive layer may be used as a mask to perform conductor treatment on the active layer, i.e., the region of the active layer covered by the first conductive layer may form a channel region of the transistor, and the region of the active layer not covered by the first conductive layer forms a conductor structure.

As shown in FIGS. 18, 21, and 25, the second conductive layer may include a first initial signal line Vinit1, a second initial signal line Vinit2, a second conductive portion 22, a third conductive portion 23, and a fourth conductive portion 24. The first initial signal line Vinit1 may be used to provide the first initial signal terminal in FIG. 14. The second initial signal line Vinit2 may be used to provide the second initial signal terminal in FIG. 14. An orthographic projection of the first initial signal line Vinit1 on the base substrate, and an orthographic projection of the second initial signal line Vinit2 on the base substrate may extend along the first direction X. An orthographic projection of the second conductive portion 22 on the base substrate may at least partially overlap with the orthographic projection of the first conductive portion 11 on the base substrate, and the second conductive portion 22 may be used to form a second electrode of the first capacitor C1, wherein a plurality of the second conductive portions 22 distributed in the first direction X may be connected in sequence. The third conductive portion 23 is connected in the same layer as the second conductive portion 22, and an orthographic projection of the third conductive portion 23 on the base substrate and an orthographic projection of an eighth active portion 78 on the base substrate are at least partially overlapped. The orthographic projection of the eighth active portion 78 on the base substrate in the first direction X has a larger dimension than an orthographic projection of the fifth active portion 75 on the base substrate in the first direction X, and the eighth active portion 78 is used to form the first electrode of the second capacitor C2. The third conductive portion 23 is used to form the second electrode of the second capacitor C2. An orthographic projection of the fourth conductive portion 24 on the base substrate and an orthographic projection of the twenty-first active portion 721 on the base substrate are at least partially overlapped. The fourth conductive portion 24 may be connected to a stable voltage source, and the fourth conductive portion 24 may stabilize the voltage of the twenty-first active portion 721, thereby improving the problem of current leakage to the source and drain of the second transistor T2 due to voltage changes in the twenty-first active portion 721.

As shown in FIGS. 18, 22, and 26, the third conductive layer may include a power line VDD, a first bridge portion 31, a second bridge portion 32, a third bridge portion 33, a fourth bridge portion 34, a fifth bridge portion 35, a sixth bridge portion 36, and a seventh bridge portion 37. The power line VDD may be used to provide the first power supply terminal in the pixel driving circuit shown in FIG. 14. An orthographic projection of the power line VDD on the base substrate may extend along a second direction Y. The second direction Y intersects the first direction X. For example, the first direction X may be a row direction and the second direction may be a column direction. The power line VDD may be connected to the fourth conductive portion 24 through a via hole (black square) to provide a stable voltage source to the fourth conductive portion 24. It is to be understood that in other exemplary embodiments, the stable voltage source may also be provided to the fourth conductive portion 24 via other signal lines, e.g., the stable voltage source may be provided to the fourth conductive portion 24 via the first initial signal line Vinit1 and the second initial signal line Vinit2. The power line VDD may also be connected to the second conductive portion 22 through a via hole to connect the second electrode of the first capacitor to the first power supply terminal. The power line VDD may also be connected to the fourteenth active portion 714 through a via hole to be connected to the first electrode of the fifth transistor T5. The first bridge portion 31 may be connected to the first conductive portion 11 and the twentieth active portion 720 through via holes, respectively, to connect the gate of the drive transistor T3 and the first electrode of the second transistor T2. As shown in FIG. 21, the second conductive portion 22 may be provided with an opening 221, and an orthographic projection, on the base substrate, of a via hole connecting the first bridge portion 31 and the first conductive portion 11 may be disposed within an orthographic projection of the opening 221 on the base substrate to avoid the conductor structure within the via hole from connecting to the second conductive portion 22. The second bridge portion 32 may be connected to the nineteenth active portion 719 and the fifteenth active portion 715 through via holes, respectively, to connect the second electrode of the first transistor T1 and the second electrode of the drive transistor. The third bridge portion 33 may be connected to the sixteenth active portion 716 and the first initial signal line Vinit1 through via holes, respectively, to connect the first electrode of the first transistor T1 and the first initial signal terminal. The fourth bridge portion 34 may be connected to a seventeenth active portion 717 and a second initial signal line Vinit2 through via holes, respectively, to connect the first electrode of the seventh transistor T7 and the second initial signal terminal. The fifth bridge portion 35 may be connected to the eighteenth active portion 718 through a via hole to be connected to the second electrode of the sixth transistor T6. The sixth bridge portion 36 may be connected to the twelfth active portion 712 and the eleventh active portion 711 through via holes, respectively, to connect the second electrode of the fourth transistor T4 and the first electrode of the drive transistor T3. The seventh bridge portion 37 may be connected to the tenth active portion 710 through a via hole to be connected to the first electrode of the fourth transistor T4.

As shown in FIGS. 18 and 23, the fourth conductive layer may include: a data line Da, a second initial connection line 4Vinit2, and an eighth bridge portion 48. Both an orthographic projection of the data line Da on the base substrate and an orthographic projection of the second initial connection line 4Vinit2 on the base substrate may extend in the second direction Y. The data line Da is used to provide a data signal terminal in the pixel driving circuit shown in FIG. 14, and the data line Da is connected to the seventh bridge portion 37 through a via hole to connect the first electrode of the fourth transistor to the data signal terminal. The second initial connection line 4Vinit2 is connected to the fourth bridge portion 34 through a via hole to be connected to the second initial signal line Vinit2 that intersects the second initial connection line 4Vinit2, and the second initial connection line 4Vinit2 and the second initial signal line Vinit2 form a grid structure, so that a voltage difference of the second initial signal line Vinit2 at different locations of the display panel can be reduced. The eighth bridge portion 48 is connected to the fifth bridge portion 35 through a via hole to be connected to the second electrode of the sixth transistor. The eighth bridge portion 48 may be used to be connected to the first electrode of the light-emitting unit.

It is to be understood that in other exemplary embodiments, the first initial signal line Vinit1, the second initial signal line Vinit2, and the second initial connection line 4Vinit2 may also be located in other conductive layers. The display panel may also include a first initial signal connection line. An orthographic projection of the first initial signal connection line on the base substrate extends along the second direction Y. The first initial signal connection line is connected to the first initial signal line, which intersects the first initial signal connection line, through a via hole, and the first initial signal connection line may form a grid structure with the first initial signal line. Orthographic projections of the first initial signal connection line and the second initial signal connection line on the base substrate are alternately distributed in the first direction. Furthermore, in other exemplary embodiments, the layout structure shown in FIG. 18 may also be provided without the eighth active portion 78 and the third conductive portion 23, so that the layout structure may form the pixel driving circuit shown in FIG. 9.

Figure 27:
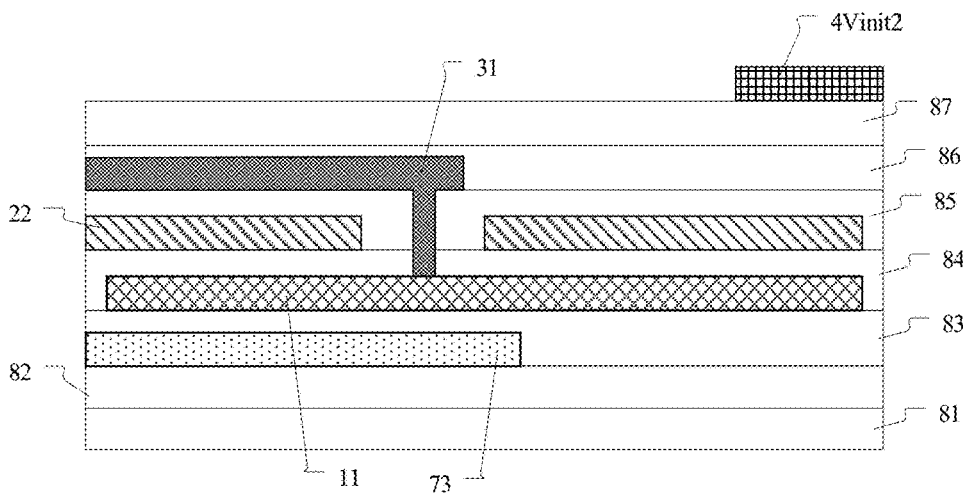
FIG. 27 is a partial cross-sectional view of the display panel shown in FIG. 18 sectioned along dashed line AA.

As shown in FIG. 27, it is a partial cross-sectional view of the display panel shown in FIG. 18 sectioned along the dashed line AA. The display panel may further include a buffer layer 82, a first insulating layer 83, a second insulating layer 84, a first dielectric layer 85, a passivation layer 86, and a flat layer 87, wherein the base substrate 81, the buffer layer 82, the active layer, the first insulating layer 83, the first conductive layer, the second insulating layer 84, the second conductive layer, the first dielectric layer 85, the third conductive layer, the passivation layer 86, the flat layer 87, and the fourth conductive layers are stacked in sequence. The first insulating layer 83 and the second insulating layer 84 may be silicon oxide layers. The first dielectric layer 85 may be a silicon nitride layer. The material of the passivation layer 86 or the buffer layer 82 may be silicon oxide, silicon nitride, and the like. The material of the flat layer 87 may be an organic material, such as a polyimide (PI), polyethylene terephthalate (PET), polyethylene naphthalene dicarboxylate (PEN), Silicon On Glass (SOG), and other materials. The base substrate 81 may include a glass substrate, a barrier layer, and a polyimide layer stacked in sequence, wherein the barrier layer may be made of an inorganic material. The material of the first conductive layer or the second conductive layer may be one of: molybdenum, aluminum, copper, titanium, and niobium, or may be an alloy, or may be a molybdenum or titanium alloy, or may be a stacked layer of molybdenum and titanium. The material of the third conductive layer or the fourth conductive layer may include a metallic material, for example, it may be one of: molybdenum, aluminum, copper, titanium, and niobium, or may be an alloy, or may be a molybdenum or titanium alloy, or may be a stacked layer of molybdenum and titanium, etc., or it may be a stacked layer of titanium, aluminum, and titanium.

Figure 31:
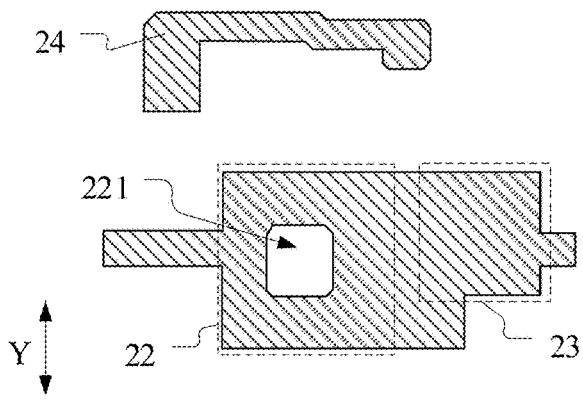
FIG. 31 is a structural layout of a second conductive layer in FIG. 28.
Figure 31:
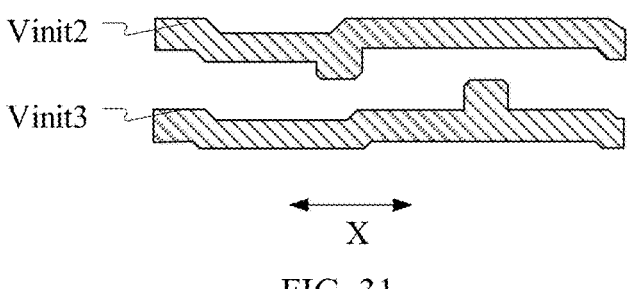
Figure 32:
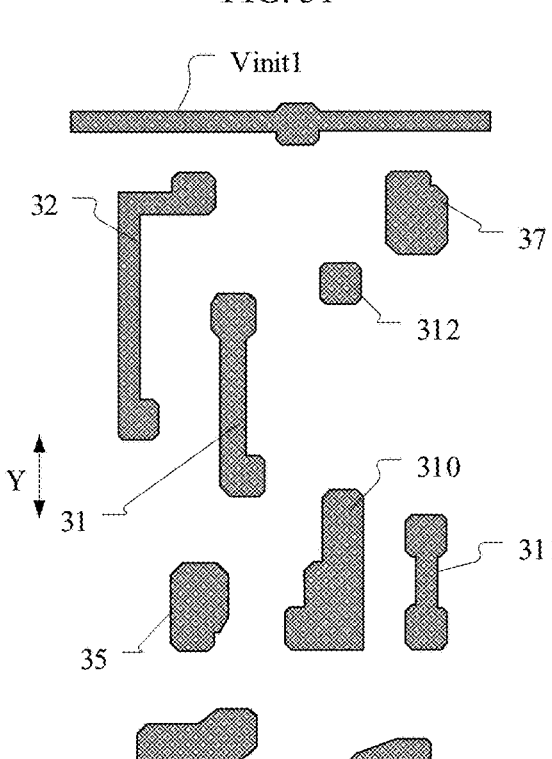
FIG. 32 is a structural layout of a third conductive layer in FIG. 28.
Figure 32:
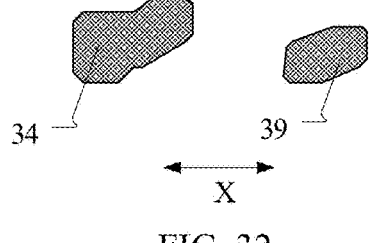
Figure 33:
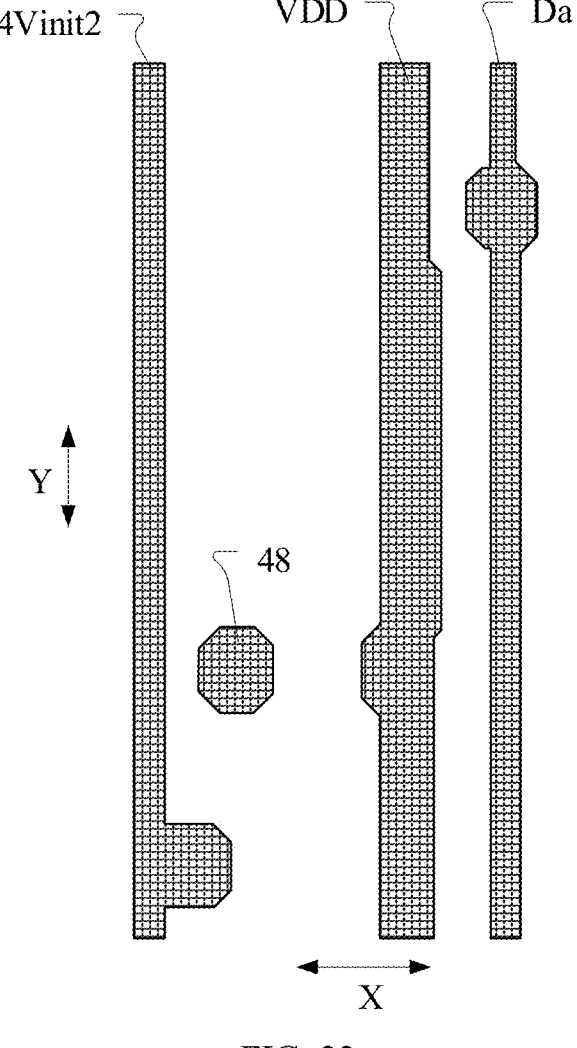
FIG. 33 is a structural layout of a fourth conductive layer in FIG. 28.
Figure 34:
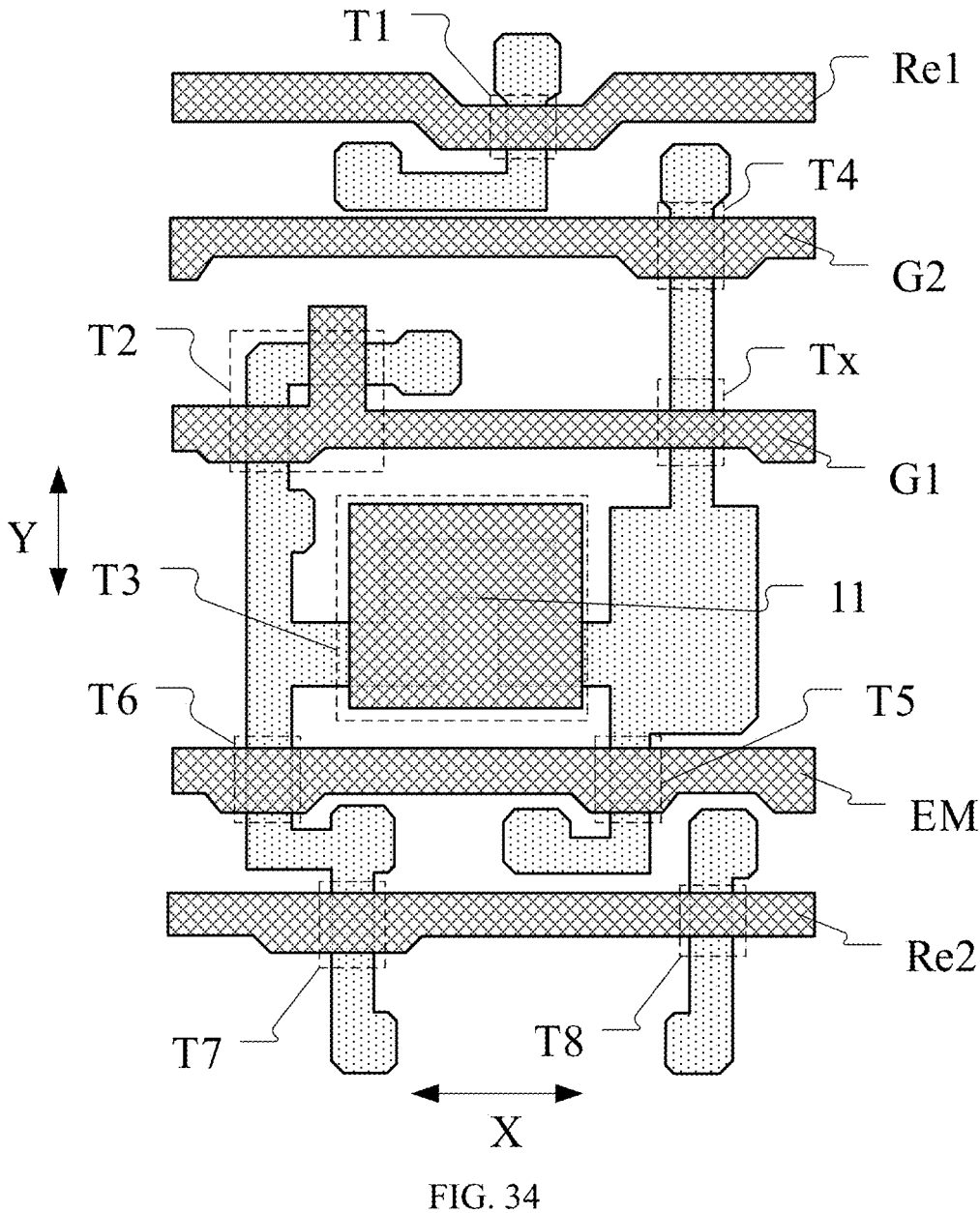
FIG. 34 is a structural layout of the active layer and the first conductive layer in FIG. 28.
Figure 35:
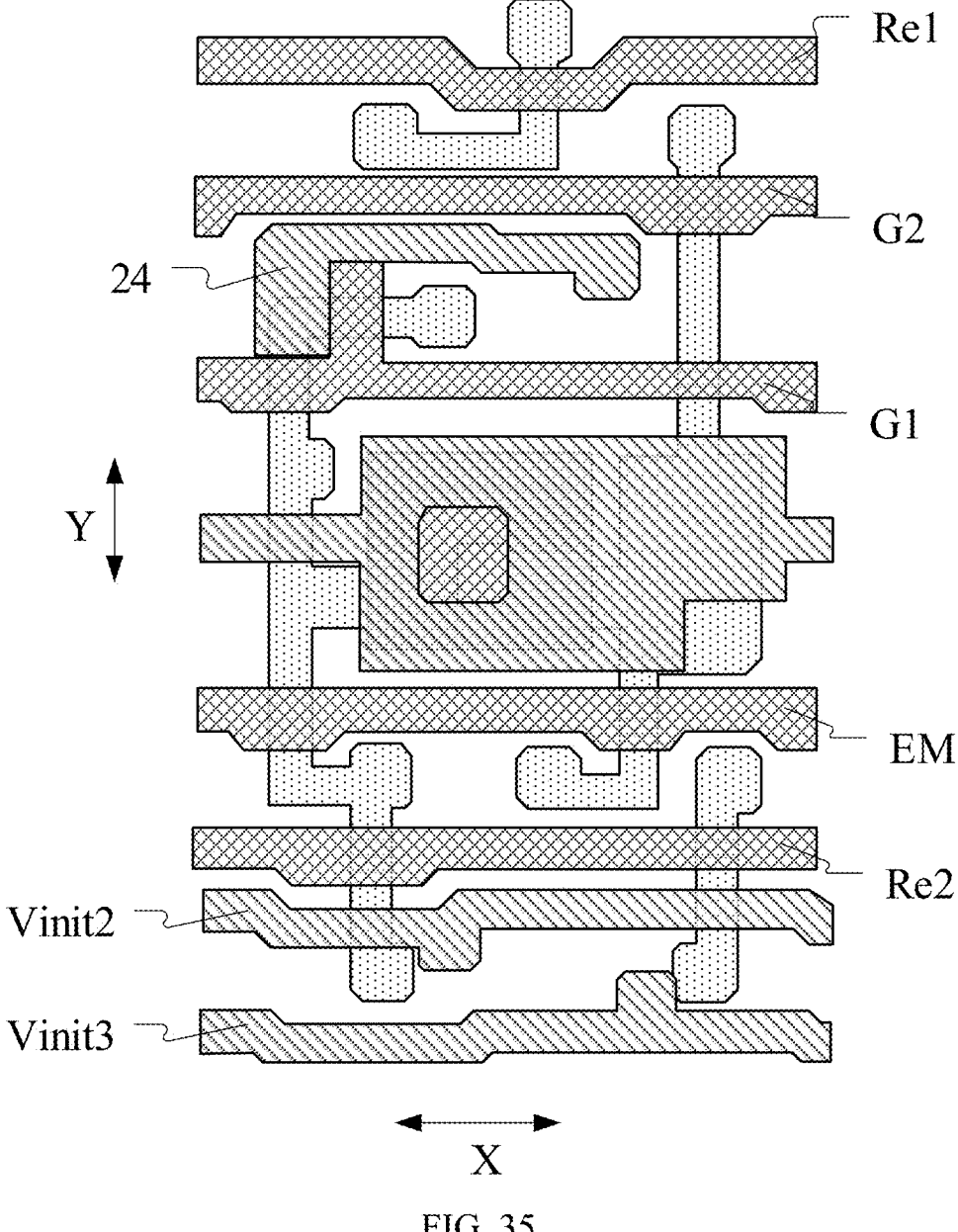
FIG. 35 is a structural layout of the active layer, the first conductive layer, and the second conductive layer in FIG. 28.
Figure 36:
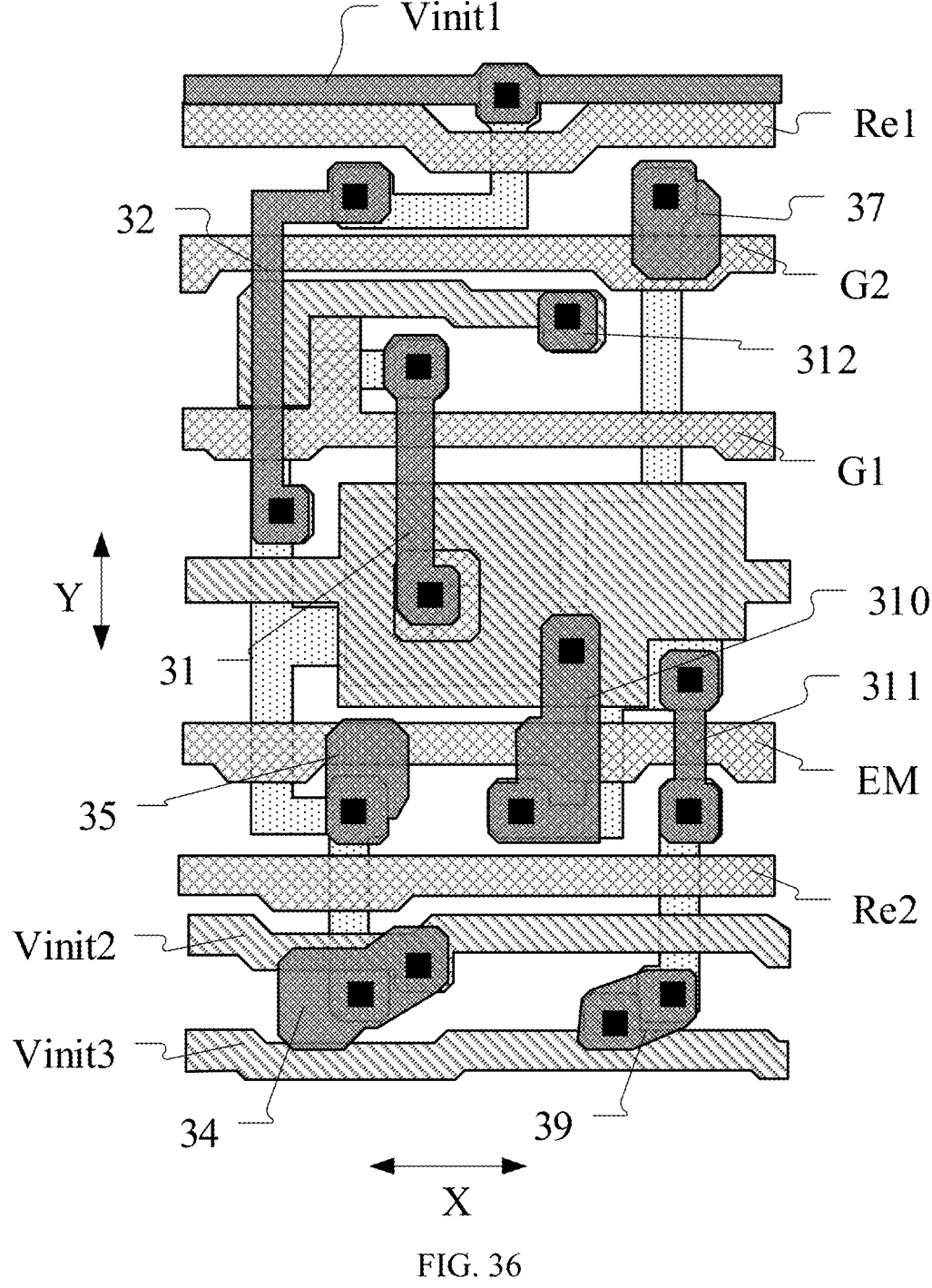
FIG. 36 is a structural layout of the active layer, the first conductive layer, the second conductive layer, and the third conductive layer in FIG. 28.

An exemplary embodiment further provides another display panel, which may include a plurality of pixel driving circuits as shown in FIG. 15. In this exemplary embodiment, the display panel may further include a base substrate, an active layer, a first conductive layer, a second conductive layer, a third conductive layer, and a fourth conductive layer that are stacked in sequence, and an insulating layer may be disposed between the above structural layers. As shown in FIGS. 28-36, FIG. 28 is a structural layout of a display panel according to another exemplary embodiment of the present disclosure; FIG. 29 is a structural layout of an active layer in FIG. 28; FIG. 30 is a structural layout of a first conductive layer in FIG. 28; FIG. 31 is a structural layout of a second conductive layer in FIG. 28; FIG. 32 is a structural layout of a third conductive layer in FIG. 28; FIG. 33 is a structural layout of a fourth conductive layer in FIG. 28; FIG. 34 is a structural layout of the active layer and the first conductive layer in FIG. 28; FIG. 35 is a structural layout of the active layer, the first conductive layer, and the second conductive layer in FIG. 28; and FIG. 36 is a structural layout of the active layer, the first conductive layer, the second conductive layer, and the third conductive layer in FIG. 28.

Figure 28:
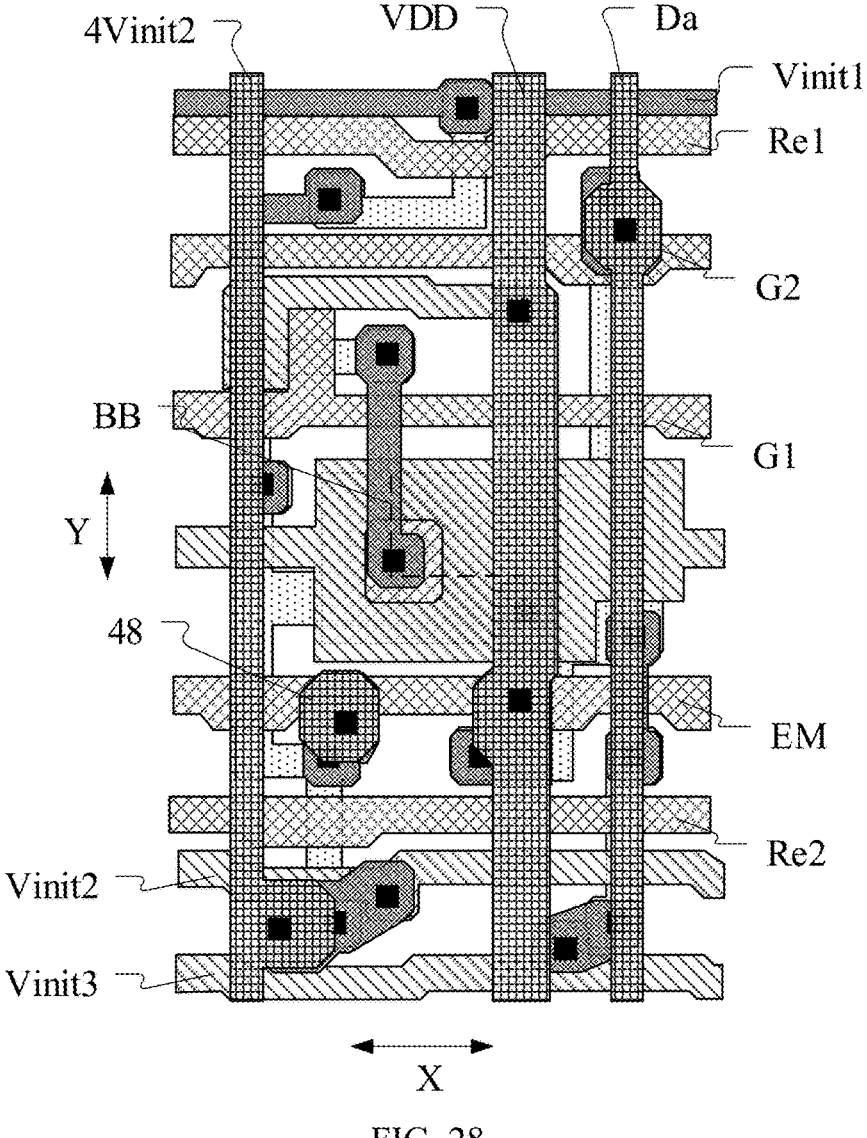
FIG. 28 is a structural layout of a display panel according to another exemplary embodiment of the present disclosure.
Figures 29, 30:
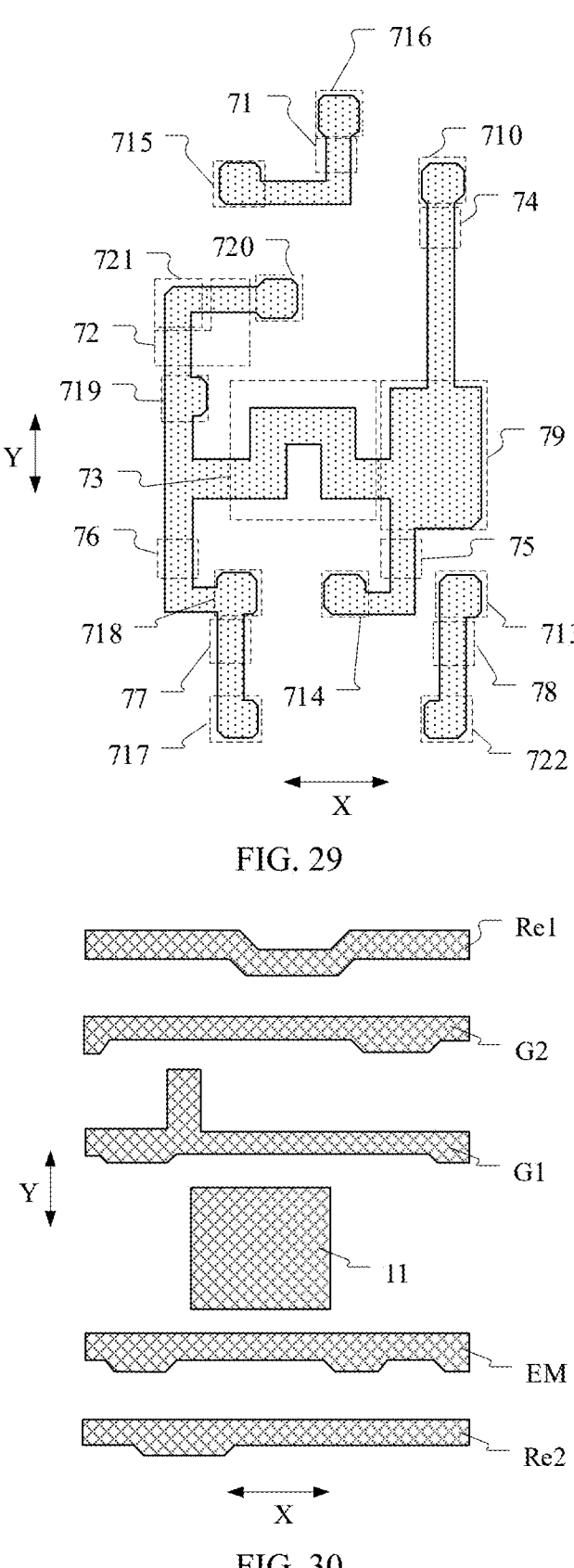
FIG. 29 is a structural layout of an active layer in FIG. 28.
FIG. 30 is a structural layout of a first conductive layer in FIG. 28.

As shown in FIGS. 28, 29, and 34, the active layer may include a first active portion 71, a second active portion 72, a third active portion 73, a fourth active portion 74, a fifth active portion 75, a sixth active portion 76, a seventh active portion 77, and an eighth active portion 78. The first active portion 71 is used to form a channel region for the first transistor T1, the second active portion 72 is used to form a channel region for the second transistor T2, the third active portion 73 is used to form a channel region for the drive transistor T3, the fourth active portion 74 is used to form a channel region for the fourth transistor T4, the fifth active portion 75 is used to form a channel region for the fifth transistor T5, the sixth active portion 76 is used to form a channel region for the sixth transistor T6, the seventh active portion 77 is used to form a channel region for the seventh transistor T7, and the eighth active portion 78 is used to form a channel region for the eighth transistor T8. The active layer may further include a ninth active portion 79, a tenth active portion 710, a thirteenth active portion 713, a fourteenth active portion 714, a fifteenth active portion 715, a sixteenth active portion 716, a seventeenth active portion 717, an eighteenth active portion 718, a nineteenth active portion 719, a twentieth active portion 720, a twenty-first active portion 721, and a twenty-second active portion 722. The ninth active portion 79 is connected between the third active portion 73 and the fifth active portion 75. The tenth active portion 710 is connected to an end of the fourth active portion 74 that is away from the third active portion 73. The thirteenth active portion 713 and the twenty-second active portion 722 are connected to two ends of the eighth active portion 78. The fourteenth active portion 714 is connected to an end of the fifth active portion 75 away from the ninth active portion 79. The fifteenth active portion 715 and the sixteenth active portion 716 are connected to two ends of the first active portion 71. The seventeenth active portion 717 is connected to an end of the seventh active portion 77 away from the sixth active portion 76. The eighteenth active portion 718 is connected between the seventh active portion 77 and the sixth active portion 76. The nineteenth active portion 719 is connected between the second active portion 72 and the third active portion 73. The twentieth active portion 720 is connected to an end of the second active portion 72 away from the third active portion 73. The twenty-first active portion 721 is connected between the dual channels of the second transistor. The active layer may be formed from a polysilicon material, and accordingly, the first transistor T1, the second transistor T2, the drive transistor T3, the fourth transistor T4, the fifth transistor T5, the sixth transistor T6, the seventh transistor T7, and the eighth transistor T8 may be P-type low-temperature polycrystalline silicon thin-film transistors.

As shown in FIGS. 28, 30, and 34, the first conductive layer may include: a first reset signal line Re1, a second reset signal line Re2, a first gate line G1, a second gate line G2, an enabling signal line EM, and a first conductive portion 11. The first reset signal line Re1 is used to provide the first reset signal terminal in FIG. 15. The second reset signal line Re2 is used to provide the second reset signal terminal in FIG. 15. The first gate line G1 is used to provide the first gate drive signal terminal in FIG. 15. The second gate line G2 is used to provide the second gate drive signal terminal in FIG. 15. The enabling signal line EM is used to provide the enabling signal terminal in FIG. 15. An orthographic projection of the first reset signal line Re1 on the base substrate may extend along the first direction X and cover an orthographic projection of the first active portion 71 on the base substrate, and a portion of the structure of the first reset signal line Re1 is used to form the gate of the first transistor T1. An orthographic projection of the second reset signal line Re2 on the base substrate may extend in the first direction X and cover orthographic projections of the seventh active portion 77 and the eighth active portion 78 on the base substrate, and a portion of the structure of the second reset signal line Re2 is used to form the gate of the seventh transistor T7 and the gate of the eighth transistor T8, respectively. An orthographic projection of the first gate line G1 on the base substrate may extend in the first direction X and cover an orthographic projection of the second active portion 72 on the base substrate, and a portion of the structure of the first gate line G1 is used to form the gate of the second transistor T2. An orthographic projection of the second gate line G2 on the base substrate may extend in the first direction X and cover an orthographic projection of the fourth active portion 74 on the base substrate, and a portion of the structure of the second gate line G2 is used to form the gate of the fourth transistor T4. An orthographic projection of the enabling signal line EM on the base substrate may extend in the first direction X and cover orthographic projections of the fifth active portion 75 and the sixth active portion 76 on the base substrate, and a portion of the structure of the enabling signal line EM is used to form the gate of the fifth transistor T5 and the gate of the sixth transistor T6, respectively. An orthographic projection of the first conductive portion 11 on the base substrate covers an orthographic projection of the third active portion 73 on the base substrate, and the first conductive portion 11 is used to form the gate of the drive transistor T3 and the first electrode of the first capacitor C. In addition, in the display panel, the first conductive layer may be used as a mask to perform conductor treatment on the active layer, i.e., the region of the active layer covered by the first conductive layer may form a channel region of the transistor, and the region of the active layer not covered by the first conductive layer forms a conductor structure. As shown in FIGS. 28, 30, and 34, the fourth active portion 74 is connected to the ninth active portion 79 and the third active portion 73 in the same layer, and the second electrode of the fourth transistor T4 can be connected to the first electrode of the drive transistor and the first electrode of the second capacitor through the active layer, and this setting can reduce the number of bridge portions and via holes of the display panel. Meanwhile, the active layer between the fourth active portion 74 and the ninth active portion 79 and the first gate line G1 form a transistor Tx which is connected between the first electrode of the second capacitor and the second electrode of the fourth transistor, and since the transistor Tx turns on when the fourth transistor T4 needs to be turned on as well, the transistor Tx does not interfere with the normal driving of the pixel driving circuit.

As shown in FIGS. 28, 31, and 35, the second conductive layer may include a second initial signal line Vinit2, a third initial signal line Vinit3, a second conductive portion 22, a third conductive portion 23, and a fourth conductive portion 24. The second initial signal line Vinit2 may be used to provide the second initial signal terminal in FIG. 15. The third initial signal line Vinit3 may be used to provide the third initial signal terminal in FIG. 15. Both an orthographic projection of the second initial signal line Vinit2 on the base substrate and an orthographic projection of the third initial signal line Vinit3 on the base substrate may extend along the first direction X. An orthographic projection of the second conductive portion 22 on the base substrate may at least partially overlap with the orthographic projection of the first conductive portion 11 on the base substrate. The second conductive portion 22 may be used to form the second electrode of the first capacitor C1, wherein a plurality of the second conductive portions 22 distributed in the first direction X may be connected in sequence. The third conductive portion 23 is connected in the same layer as the second conductive portion 22, and an orthographic projection of the third conductive portion 23 on the base substrate and an orthographic projection of the eighth active portion 78 on the base substrate are at least partially overlapped. The orthographic projection of the eighth active portion 78 on the base substrate in the first direction X has a larger dimension than an orthographic projection of the fifth active portion 75 on the base substrate in the first direction X, and the eighth active portion 78 is used to form the first electrode of the second capacitor C2. The third conductive portion 23 is used to form the second electrode of the second capacitor. An orthographic projection of the fourth conductive portion 24 on the base substrate and an orthographic projection of the twenty-first active portion 721 on the base substrate are at least partially overlapped. The fourth conductive portion 24 may be connected to a stable voltage source, and the fourth conductive portion 24 may stabilize the voltage of the twenty-first active portion 721, thereby improving the problem of current leakage to the source and drain of the second transistor T2 due to voltage changes in the twenty-first active portion 721.

As shown in FIGS. 28, 32, and 36, the third conductive layer may include a first initial signal line Vinit1, a first bridge portion 31, a second bridge portion 32, a fourth bridge portion 34, a fifth bridge portion 35, a seventh bridge portion 37, a ninth bridge portion 39, a tenth bridge portion 310, an eleventh bridge portion 311, and a twelfth bridge portion 312. The first initial signal line Vinit1 is used to provide the first initial signal terminal in FIG. 15. An orthographic projection of the first initial signal line Vinit1 on the base substrate may extend along the first direction X, and the first initial signal line Vinit1 may be connected to the sixteenth active portion 716 through a via hole to be connected to the first electrode of the first transistor T1. The first bridge portion 31 may be connected to the first conductive portion 11 and the twentieth active portion 720 through via holes, respectively, to connect the gate of the drive transistor T3 and the first electrode of the second transistor T2. As shown in FIG. 31, the second conductive portion 22 may be provided with an opening 221, and an orthographic projection, on the base substrate, of the via hole connecting the first bridge portion 31 and the first conductive portion 11 may be disposed within an orthographic projection of the opening 221 on the base substrate to avoid the conductor structure within the via hole from connecting to the second conductive portion 22. The second bridge portion 32 may be connected to the nineteenth active portion 719 and the fifteenth active portion 715 through via holes, respectively, to connect the second electrode of the first transistor and the second electrode of the drive transistor. The fourth bridge portion 34 may be connected to the seventeenth active portion 717 and the second initial signal line Vinit2 through via holes, respectively, to connect the first electrode of the seventh transistor T7 and the second initial signal terminal. The fifth bridge portion 35 may be connected to the eighteenth active portion 718 through a via hole to be connected to the second electrode of the sixth transistor. The seventh bridge portion 37 may be connected to the tenth active portion 710 through a via hole to be connected to the first electrode of the fourth transistor. The ninth bridge portion 39 may be connected to the twenty-second active portion 722 and the third initial signal line Vinit3 through via holes, respectively, to connect the first electrode of the eighth transistor and the third initial signal terminal. The tenth bridge portion 310 may be connected to the second conductive portion 22 and the fourteenth active portion 714 through via holes, respectively, to connect the first electrode of the fifth transistor and the second electrode of the first capacitor. The eleventh bridge portion 311 may be connected to the thirteenth active portion 713 and the ninth active portion 79 through via holes, respectively, to connect the second electrode of the eighth transistor and the first electrode of the drive transistor. The twelfth bridge portion 312 may be connected to the fourth conductive portion 24 through a via hole.

As shown in FIGS. 28 and 33, the fourth conductive layer may include: a data line Da, a second initial connection line 4Vinit2, an eighth bridge portion 48, and a power line VDD. Orthographic projections of the data line Da, the second initial connection line 4Vinit2, and the power line VDD on the base substrate may all extend along the second direction Y. The data line Da is used to provide a data signal terminal in the pixel driving circuit shown in FIG. 15, and the data line Da is connected to the seventh bridge portion 37 through a via hole to connect the first electrode of the fourth transistor to the data signal terminal. The second initial connection line 4Vinit2 is connected to the fourth bridge portion 34 through a via hole to be connected to the second initial signal line Vinit2 that intersects the second initial connection line 4Vinit2, and the second initial connection line 4Vinit2 and the second initial signal line Vinit2 form a grid structure, so that a voltage difference of the second initial signal line Vinit2 at different locations of the display panel can be reduced. The eighth bridge portion 48 is connected to the fifth bridge portion 35 through a via hole to be connected to the second electrode of the sixth transistor. The eighth bridge portion 48 may be used to connect the first electrode of the light-emitting unit. The power line VDD may be connected to the tenth bridge portion 310 through a via hole to connect the first power supply terminal and the first electrode of the fifth transistor, the second electrode of the first capacitor, and the second electrode of the second capacitor. The power line VDD may also be connected to the twelfth bridge portion 312 through a via hole to provide a stable voltage signal to the fourth conductive portion 24.

It is to be understood that in other exemplary embodiments, the first initial signal line Vinit1, the second initial signal line Vinit2, the third initial signal line Vinit3, and the second initial connection line 4Vinit2 may also be located in other conductive layers. The display panel may also include a first initial signal connection line and a third initial signal connection line. Orthographic projections of the first initial signal connection line and the third initial signal connection line on the base substrate extend along the second direction Y. The first initial signal connection line is connected to the first initial signal line, which intersects the first initial signal connection line, through a via hole, and the first initial signal connection line may form a grid structure with the first initial signal line. The third initial signal connection line is connected to the third initial signal line, that intersects the third initial signal connection line, through a via hole, and the third initial signal connection line may form a grid structure with the third initial signal line. The orthographic projections of the first initial signal connection line, the second initial signal connection line, and the third initial signal connection line on the base substrate are alternately distributed in the first direction. Furthermore, in other exemplary embodiments, the layout structure shown in FIG. 28 may also be provided without the eighth active portion 78 and the third conductive portion 23, so that the layout structure may form the pixel driving circuit shown in FIG. 11.

Figure 37:
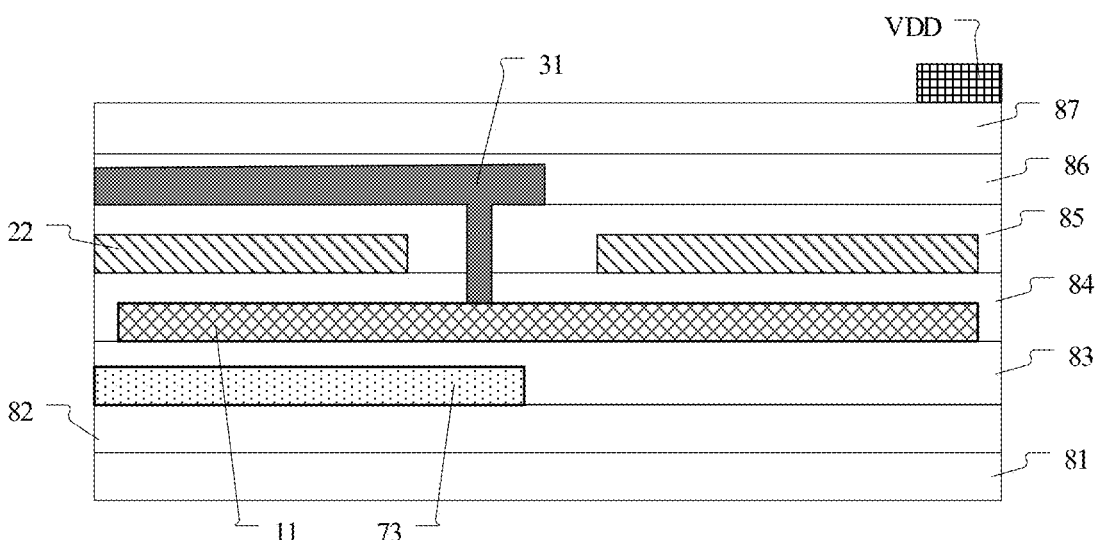
FIG. 37 is a partial cross-sectional view of the display panel shown in FIG. 28 sectioned along dashed line BB.

As shown in FIG. 37, it is a partial cross-sectional view of the display panel shown in FIG. 28 sectioned along the dashed line BB. The display panel may further include a buffer layer 82, a first insulating layer 83, a second insulating layer 84, a first dielectric layer 85, a passivation layer 86, and a flat layer 87, wherein the base substrate 81, the buffer layer 82, the active layer, the first insulating layer 83, the first conductive layer, the second insulating layer 84, the second conductive layer, the first dielectric layer 85, the third conductive layer, the passivation layer 86, the flat layer 87, and the fourth conductive layer are stacked in sequence. The first insulating layer 83 and the second insulating layer 84 may be silicon oxide layers. The first dielectric layer 85 may be a silicon nitride layer. The material of the passivation layer 86 or the buffer layer 82 may be silicon oxide, silicon nitride, and the like. The material of the flat layer 87 may be an organic material, such as a polyimide (PI), polyethylene terephthalate (PET), polyethylene naphthalene dicarboxylate (PEN), Silicon On Glass (SOG), and other materials.

The base substrate 81 may include a glass substrate, a barrier layer, and a polyimide layer stacked in sequence, wherein the barrier layer may be made of an inorganic material. The material of the first conductive layer or the second conductive layer may be one of: molybdenum, aluminum, copper, titanium, and niobium, or may be an alloy, or may be a molybdenum or titanium alloy, or may be a stacked layer of molybdenum and titanium. The material of the third conductive layer or the fourth conductive layer may include a metallic material, for example, it may be one of: molybdenum, aluminum, copper, titanium, and niobium, or may be an alloy, or may be a molybdenum or titanium alloy, or may be a stacked layer of molybdenum and titanium, etc., or it may be a stacked layer of titanium, aluminum, and titanium.

It is to be noted that, as shown in FIGS. 18, 26, 28, and 36, the black squares, drawn on the side of the third conductive layer away from the base substrate, indicate the via holes that connect the third conductive layer to the other layers on the side of the third conductive layer facing the base substrate; and the black squares, drawn on the side of the fourth conductive layer away from the base substrate, indicate the via holes that connect the fourth conductive layer to the other layers on the side of the fourth conductive layer facing the base substrate. The black squares indicate only the locations of the via holes, and the different via holes indicated by the black squares at different locations may traverse through different insulating layers.

It is to be noted that the proportions of the accompanying drawings in the present disclosure can be used as a reference in the actual process, but are not limited thereto, for example, a width-to-length ratio of a channel, a thickness of each film layer and spacing between film layers, and a width of each signal line and spacing between signal lines, can be adjusted according to the actual needs. In the exemplary embodiments, an orthographic projection of a certain structure on the base substrate extends in a certain direction, which can be understood as either a straight-line extension or a bent extension of the orthographic projection of the structure on the base substrate along that direction. The number of pixels in the display substrate and the number of sub-pixels in each pixel are also not limited to the number shown in the drawings, and the accompanying drawings depicted in the present disclosure are only schematic diagrams of the structure. In addition, the qualifiers such as first, second, etc. are only used to qualify the names of the different structures, which do not have the meaning of a particular order or number. A transistor is an element that includes at least three terminals, i.e., a gate, a drain, and a source. The transistor has a channel region between the drain (drain-electrode terminal, drain region, or drain electrode) and the source (source-electrode terminal, source region, or source electrode), and current can flow through the drain, the channel region, and the source. In this exemplary embodiment, the channel region is the region through which the current primarily flows. In this exemplary embodiment, the first electrode may be a drain and the second electrode may be a source, or the first electrode may be a source and the second electrode may be a drain. In the case where transistors of opposite polarity are used, or in the case where the direction of the current in the circuit operation changes, the functions of the "source" and the "drain" sometimes interchange. Therefore, in this exemplary embodiment, the "source" and the "drain" can be interchanged. In addition, the gate may be referred to as a control electrode.

An exemplary embodiment also provides a display device in which a display panel as described above is included. The display device may be a display device such as a cell phone, a tablet computer, a television, and the like.

Those skilled in the art will easily conceive of other embodiments of the present disclosure after considering the specification and practicing the content disclosed herein. This application is intended to cover any variations, uses, or adaptations of the present disclosure that follow the general principles of the present disclosure and include common knowledge or customary technical means in the art not disclosed herein. The specification and embodiments are to be regarded as exemplary only, and the true scope and spirit of the present disclosure is indicated by the claims.

The accompanying drawings in the present disclosure relate only to the structures involved in the present disclosure, and other structures can be referred to the usual design. Without conflict, the embodiments of the present disclosure and the features in the embodiments may be combined with each other to obtain new embodiments. Those of ordinary skill in the art should understand that modifications or equivalent substitutions can be made to the technical solutions of the present disclosure without departing from the spirit and scope of the technical solutions of the present disclosure, and all should be covered by the scope of the claims of the present disclosure.

It is to be understood that the present disclosure is not limited to the precise structure that has been described above and illustrated in the accompanying drawings, and that various modifications and changes may be made without departing from its scope. The scope of the present disclosure is limited only by the appended claims.

What is claimed is:

1. A pixel driving circuit, comprising:
a drive circuit, connected to a first node, a second node, and a third node, and configured to input a driving current to the third node using the second node based on a voltage of the first node;
a first compensation circuit, connected to the first node, the third node, and a first gate drive signal terminal, and configured to connect the first node to the third node in response to a signal from the first gate drive signal terminal;
a first reset circuit, connected to the third node, a first reset signal terminal, and a first initial signal terminal, and configured to transmit a signal from the first initial signal terminal to the third node in response to a signal from the first reset signal terminal; and
a third reset circuit, connected to the second node, a third initial signal terminal, and a second reset signal terminal, and configured to transmit a signal from the third initial signal terminal to the second node in response to a signal from the second reset signal terminal,
wherein the pixel driving circuit is configured to drive a light-emitting unit to emit light, and further comprises:
a second reset circuit, wherein the second reset circuit, the first reset circuit, and the third reset circuit have a same polarity of conduction level; and
wherein the second reset circuit is connected to a first electrode of the light-emitting unit, a second initial signal terminal, the first reset signal terminal, and the second reset signal terminal; and the second reset circuit is configured to transmit a signal from the second initial signal terminal to the first electrode of the light-emitting unit in response to the signal from the first reset signal terminal, and the second reset circuit is configured to transmit the signal from the second initial signal terminal to the first electrode of the light-emitting unit in response to the signal from the second reset signal terminal; and
wherein the second reset circuit comprises:
a seventh transistor with a first electrode connected to the second initial signal terminal, a second electrode connected to the first electrode of the light-emitting unit, and a gate connected to the first reset signal terminal; and
a ninth transistor with a first electrode connected to the second initial signal terminal, a second electrode connected to the first electrode of the light-emitting unit, and a gate connected to the second reset signal terminal,
wherein the pixel driving circuit further comprises:
a second storage circuit connected to the second node and configured to store a charge of the second node;
wherein the second storage circuit comprises:
a second capacitor with a first electrode connected to the second node,
wherein the pixel driving circuit further comprises:
a second compensation circuit, connected to the first node and a reference signal terminal, and configured to transmit a signal from the reference signal terminal to the first node; wherein the second compensation circuit comprises:
a tenth transistor with a first electrode connected to the reference signal terminal and a gate connected to the first node.

2. The pixel driving circuit of claim 1, wherein the drive circuit comprises:
a drive transistor with a first electrode connected to the second node, a second electrode connected to the third node, and a gate connected to the first node;
wherein the first compensation circuit comprises:
a second transistor with a first electrode connected to the first node, a second electrode connected to the third node, and a gate connected to the first gate drive signal terminal;
and wherein the first reset circuit comprises:
a first transistor with a first electrode connected to the first initial signal terminal, a second electrode connected to the third node, and a gate connected to the first reset signal terminal.

3. The pixel driving circuit of claim 1, wherein the third reset circuit comprises:
an eighth transistor with a first electrode connected to the third initial signal terminal, a second electrode connected to the second node, and a gate connected to the second reset signal terminal.

4. The pixel driving circuit of claim 1, wherein the pixel driving circuit further comprises:
a data writing circuit, connected to the second node, a data signal terminal, and a second gate drive signal terminal, and configured to transmit a signal from the data signal terminal to the second node in response to a signal from the second gate drive signal terminal; a light-emitting control circuit, connected to a first power supply terminal, the second node, the third node, a first electrode of the light-emitting unit, and an enabling signal terminal, and configured to connect the first power supply terminal to the second node in response to a signal from the enabling signal terminal, and to connect the third node to the first electrode of the light-emitting unit in response to the signal from the enabling signal terminal; and a first storage circuit connected between the first node and the first power supply terminal; and wherein the data writing circuit comprises:

a fourth transistor with a first electrode connected to the data signal terminal, a second electrode connected to the second node, and a gate connected to the second gate drive signal terminal;

wherein the light-emitting control circuit comprises:

a fifth transistor with a first electrode connected to the first power supply terminal, a second electrode connected to the second node, and a gate connected to the enabling signal terminal; and a sixth transistor with a first electrode connected to the third node, a second electrode connected to the first electrode of the light-emitting unit, and a gate connected to the enabling signal terminal; and wherein the first storage circuit comprises:

a first capacitor connected between the first node and the first power supply terminal.

5. A method for driving a pixel driving circuit, wherein the pixel driving circuit comprises:

a drive circuit, connected to a first node, a second node, and a third node, and configured to input a driving current to the third node using the second node based on a voltage of the first node;

a first compensation circuit, connected to the first node, the third node, and a first gate drive signal terminal, and configured to connect the first node to the third node in response to a signal from the first gate drive signal terminal;

a first reset circuit, connected to the third node, a first reset signal terminal, and a first initial signal terminal, and configured to transmit a signal from the first initial signal terminal to the third node in response to a signal from the first reset signal terminal; and a third reset circuit, connected to the second node, a third initial signal terminal, and a second reset signal terminal, and configured to transmit a signal from the third initial signal terminal to the second node in response to a signal from the second reset signal terminal, wherein the pixel driving circuit is configured to drive a light-emitting unit to emit light, and further comprises:

a second reset circuit, wherein the second reset circuit, the first reset circuit, and the third reset circuit have a same polarity of conduction level; and wherein the second reset circuit is connected to a first electrode of the light-emitting unit, a second initial signal terminal, the first reset signal terminal, and the second reset signal terminal; and the second reset circuit is configured to transmit a signal from the second initial signal terminal to the first electrode of the light-emitting unit in response to the signal from the first reset signal terminal, and the second reset circuit is configured to transmit the signal from the second initial signal terminal to the first electrode of the light-emitting unit in response to the signal from the second reset signal terminal; and wherein the second reset circuit comprises:

a seventh transistor with a first electrode connected to the second initial signal terminal, a second electrode connected to the first electrode of the light-emitting unit, and a gate connected to the first reset signal terminal; and a ninth transistor with a first electrode connected to the second initial signal terminal, a second electrode connected to the first electrode of the light-emitting unit, and a gate connected to the second reset signal terminal, wherein the pixel driving circuit further comprises:

a second storage circuit connected to the second node and configured to store a charge of the second node;

wherein the second storage circuit comprises:

a second capacitor with a first electrode connected to the second node, wherein the pixel driving circuit further comprises:

a second compensation circuit, connected to the first node and a reference signal terminal, and configured to transmit a signal from the reference signal terminal to the first node;

wherein the second compensation circuit comprises:

a tenth transistor with a first electrode connected to the reference signal terminal and a gate connected to the first node, wherein the method comprises: in a first phase, inputting an active level to the first reset signal terminal and inputting an inactive level to the first gate drive signal terminal; and in a second phase, inputting an active level to the first reset signal terminal and the first gate drive signal terminal.

6. The method of claim 5, wherein the pixel driving circuit further comprises: a data writing circuit, connected to the second node, a data signal terminal, and a second gate drive signal terminal, and configured to transmit a signal from the data signal terminal to the second node in response to a signal from the second gate drive signal terminal; and wherein the method further comprises:

in a third phase, inputting an active level to the first gate drive signal terminal and the second gate drive signal terminal, and inputting an inactive level to the first reset signal terminal; and in a fourth phase, inputting an active level to the first gate drive signal terminal, and inputting an inactive level to the first reset signal terminal and the second gate drive signal terminal.

7. The method of claim 6, further comprising:

in a fifth phase, inputting an active level to the first reset signal terminal, and inputting an inactive level to the first gate drive signal terminal.

8. A display panel, comprising a pixel driving circuit, wherein the pixel driving circuit comprises: a drive transistor, a first transistor with a first electrode connected to a first initial signal line and a second electrode connected to a second electrode of the drive electrode, and a second transistor with a first electrode connected to a gate of the drive transistor and a second electrode connected to the second electrode of the drive electrode; wherein the display panel further comprises: a base substrate; an active layer on a side of the base substrate, the active layer comprising a first active portion configured to form a channel region for the first transistor, a second active portion configured to form a channel region for the second transistor, and a third active portion configured to form a channel region for the drive transistor; and a first conductive layer on a side of the active layer away from the base substrate, comprising a first gate line, a first reset signal line, and a first conductive portion; and wherein an orthographic projection of the first gate line on the base substrate extends in a first direction and covers an orthographic projection of the second transistor on the base substrate, a portion of the first gate line being configured to form a gate of the second transistor; an orthographic projection of the first reset signal line on the base substrate extends in the first direction and covers an orthographic projection of the first active portion on the base substrate, a portion of the first reset signal line being configured to form a gate of the first transistor; and an orthographic projection of the first conductive portion on the base substrate overs an orthographic projection of the third active portion on the base substrate, the first conductive portion being configured to form the gate of the drive transistor, wherein the pixel driving circuit further comprises: a fifth transistor with a first electrode connected to a power line and a second electrode connected to a first electrode of the drive transistor, and a second capacitor with a first electrode connected to the first electrode of the drive transistor and a second electrode connected to the power line; wherein the active layer further comprises: a fifth active portion configured to form a channel region for the fifth transistor, and a ninth active portion connected between the third active portion and the fifth active portion and configured to form the first electrode of the second capacitor; wherein the first conductive layer further comprises an enabling signal line, an orthographic projection of the enabling signal line on the base substrate extending in the first direction and covering an orthographic projection of the fifth active portion on the base substrate, a portion of the enabling signal line being configured to form a gate of the fifth transistor;

wherein a size of an orthographic projection of the ninth active portion on the base substrate in the first direction, is greater than a size of the orthographic projection of the fifth active portion on the base substrate in the first direction; and wherein the display panel further comprises: a second conductive layer on a side of the first conductive layer away from the base substrate, comprising a third conductive portion configured to form the second electrode of the second capacitor, wherein an orthographic projection of the third conductive portion on the base substrate is at least partially overlapped with the orthographic projection of the ninth active portion on the base substrate.

9. The display panel of claim 8, further comprising a light-emitting unit, wherein the pixel driving circuit further comprises: a seventh transistor with a first electrode connected to a second initial signal line and a second electrode connected to a first electrode of the light-emitting unit, and an eighth transistor with a first electrode connected to a third initial signal line and a second electrode connected to a first electrode of the drive transistor;

wherein the active layer further comprises: a seventh active portion configured to form a channel region for the seventh transistor, and an eighth active portion connected to the third active portion and configured to form a channel region for the eighth transistor;

wherein the first conductive layer further comprises a second reset signal line, an orthographic projection of the second reset signal line on the base substrate extending in the first direction and covering an orthographic projection of the seventh active portion on the base substrate and an orthographic projection of the eighth active portion on the base substrate, a portion of the second reset signal line being configured to form a gate of the seventh transistor and a gate of the eighth transistor, respectively;

wherein the orthographic projection of the first gate line on the base substrate is between the orthographic projection of the first reset signal line on the base substrate and the orthographic projection of the first conductive portion on the base substrate; and wherein the orthographic projection of the second reset signal line on the base substrate is on a side, away from the orthographic projection of the first gate line on the base substrate, of the orthographic projection of the first conductive portion on the base substrate.

10. The display panel of claim 9, wherein the pixel driving circuit further comprises a fourth transistor with a first electrode connected to a data line and a second electrode connected to the first electrode of the drive transistor;

wherein the active layer further comprises a fourth active portion configured to form a channel region for the fourth transistor, the fourth active portion and the third active portion being connected in a same layer;

wherein the first conductive layer further comprises a second gate line, an orthographic projection of the second gate line on the base substrate covering an orthographic projection of the fourth active portion on the base substrate, a portion of the second gate line being configured to form a gate of the fourth transistor; and wherein the orthographic projection of the second gate line on the base substrate is between the orthographic projection of the first gate line on the base substrate and the orthographic projection of the first reset signal line on the base substrate.

11. The display panel of claim 8, further comprising a light-emitting unit, wherein the pixel driving circuit further comprises: a seventh transistor with a first electrode connected to a second initial signal line and a second electrode connected to a first electrode of the light-emitting unit;

wherein the active layer further comprises a seventh active portion configured to form a channel region for the seventh transistor; and wherein the orthographic projection of the first reset signal line on the base substrate covers an orthographic projection of the seventh active portion on the base substrate, a portion of the first reset signal line being configured to form the gate of the seventh transistor.

* * * * *